(12) United States Patent
Hussell et al.

(10) Patent No.: US 8,591,062 B2
(45) Date of Patent: Nov. 26, 2013

(54) LED LAMP

(71) Applicant: Cree, Inc., Durham, NC (US)

(72) Inventors: Christopher P. Hussell, Cary, NC (US); John Adam Edmond, Durham, NC (US); Gerald H. Negley, Chapel Hill, NC (US); Curt Progl, Raleigh, NC (US); Mark Edmond, Raleigh, NC (US); Praneet Athalye, Morrisville, NC (US); Charles M. Swoboda, Cary, NC (US); Antony Paul van de Ven, Hong Kong (HK); Paul Kenneth Pickard, Morrisville, NC (US); Bart P. Reier, Cary, NC (US); James Michael Lay, Apex, NC (US); Peter E. Lopez, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/781,847

(22) Filed: Mar. 1, 2013

(65) Prior Publication Data
US 2013/0271991 A1    Oct. 17, 2013

Related U.S. Application Data

(63) Continuation of application No. 13/774,078, filed on Feb. 22, 2013, which is a continuation-in-part of application No. 13/467,670, filed on May 9, 2012, which is a continuation-in-part of application No. 13/446,759, filed on Apr. 13, 2012.

(60) Provisional application No. 61/738,668, filed on Dec. 18, 2012, provisional application No. 61/712,585, filed on Oct. 11, 2012, provisional application No. 61/716,818, filed on Oct. 22, 2012, provisional application No. 61/670,686, filed on Jul. 12, 2012.

(51) Int. Cl.
*F21S 4/00* (2006.01)

(52) U.S. Cl.
USPC ............ 362/249.01; 362/249.02; 362/249.06; 362/219

(58) Field of Classification Search
USPC ................... 362/249.01, 249.02, 249.06, 219
See application file for complete search history.

(56) References Cited

U.S. PATENT DOCUMENTS

| 5,463,280 | A | 10/1995 | Johnson |
| 5,585,783 | A | 12/1996 | Hall |

(Continued)

FOREIGN PATENT DOCUMENTS

| EP | 1058221 A2 | 12/2000 |
| EP | 0890059 B1 | 6/2004 |

(Continued)

OTHER PUBLICATIONS

Cree, Inc., International Application No. PCT/US2013/035400 Invitation to Pay Additional Fees, and, Where Applicable, Protest Fee, Jun. 5, 2013.

(Continued)

*Primary Examiner* — Vip Patel
(74) *Attorney, Agent, or Firm* — Dennis J. Williamson; Moore & Van Allen PLLC

(57) ABSTRACT

A lamp has an optically transmissive enclosure and a base. A tower extends from the base into the enclosure and supports an LED assembly in the enclosure. The LED assembly comprises a plurality of LEDs operable to emit light when energized through an electrical path from the base. The tower and the LED assembly are arranged such that the plurality of LEDs are disposed about the periphery of the tower in a band and face outwardly toward the enclosure to create a source of the light that appears as a glowing filament. The tower forms part of a heat sink that transmits heat from the LED assembly to the ambient environment. The LED assembly has a three-dimensional shape. An electrical interconnect connects a conductor to the heat sink where the conductor is in the electrical path between the LED assembly and the base.

30 Claims, 31 Drawing Sheets

(56) References Cited

U.S. PATENT DOCUMENTS

| | | |
|---|---|---|
| 5,655,830 A | 8/1997 | Ruskouski |
| 5,688,042 A | 11/1997 | Madadi et al. |
| 5,947,588 A | 9/1999 | Huang |
| 5,949,347 A | 9/1999 | Wu |
| 5,952,916 A | 9/1999 | Yamabe |
| 6,220,722 B1 | 4/2001 | Begemann |
| 6,276,822 B1 | 8/2001 | Bedrosian et al. |
| 6,425,678 B1 * | 7/2002 | Verdes et al. ............ 362/244 |
| 6,452,217 B1 | 9/2002 | Wojnarowski et al. |
| 6,465,961 B1 | 10/2002 | Cao |
| 6,634,770 B2 | 10/2003 | Cao |
| 6,635,987 B1 | 10/2003 | Wojnarowski et al. |
| 6,746,885 B2 | 6/2004 | Cao |
| 7,213,940 B1 | 5/2007 | Van De Ven et al. |
| 2003/0214810 A1 | 11/2003 | Zhang |
| 2004/0201990 A1 | 10/2004 | Meyer |
| 2005/0254264 A1 | 11/2005 | Sidwell et al. |
| 2009/0184618 A1 | 7/2009 | Hakata et al. |
| 2011/0006679 A1 * | 1/2011 | Stekelenburg ............ 315/35 |
| 2012/0040585 A1 | 2/2012 | Huang |

FOREIGN PATENT DOCUMENTS

| | | |
|---|---|---|
| EP | 1471564 A2 | 10/2004 |
| EP | 2236907 A2 | 10/2010 |
| EP | 2413029 A2 | 2/2012 |
| EP | 2416056 A2 | 2/2012 |
| GB | 2345954 A | 7/2000 |
| GB | 2366610 A | 3/2002 |
| JP | 11111819 A | 4/1999 |
| JP | 2000173304 A | 6/2000 |
| JP | 2001118403 A | 4/2001 |
| TW | M412319 U | 9/2011 |
| WO | 0124583 A1 | 4/2001 |
| WO | 0160119 A2 | 8/2001 |
| WO | 2011098358 A1 | 8/2011 |
| WO | 2012011279 A1 | 1/2012 |
| WO | 2012031533 A1 | 3/2012 |

OTHER PUBLICATIONS

Cree, Inc., International Application No. PCT/US2013/035403 International Search Report and Written Opinion, May 29, 2013.
U.S. Appl. No. 13/340,928, filed Dec. 30, 2011.
U.S. Appl. No. 13/462,388, filed May 2, 2012.
U.S. Appl. No. 13/662,618, filed Oct. 29, 2012.
U.S. Appl. No. 13/467,670, filed May 9, 2012.
U.S. Appl. No. 13/446,759, filed Apr. 13, 2012.
U.S. Appl. No. 61/738,668, filed Dec. 18, 2012.
U.S. Appl. No. 61/712,585, filed Oct. 11, 2012.
U.S. Appl. No. 61/716,818, filed Oct. 22, 2012.
U.S. Appl. No. 61/670,686, filed Jul. 12, 2012.
U.S. Appl. No. 13/758,565, filed Feb. 4, 2013.
U.S. Appl. No. 12/775,842, filed May 7, 2010.
U.S. Appl. No. 13/192,755, filed Jul. 28, 2011.
U.S. Appl. No. 13/339,974, filed Dec. 29, 2011.
U.S. Appl. No. 13/235,103, filed Sep. 16, 2011.
U.S. Appl. No. 13/360,145, filed Jan. 27, 2012.
U.S. Appl. No. 13/338,095, filed Dec. 27, 2011.
U.S. Appl. No. 13/338,076, filed Dec. 27, 2011.
U.S. Appl. No. 13/405,891, filed Feb. 27, 2012.
U.S. Appl. No. 13/781,844, filed Mar. 1, 2013.
U.S. Appl. No. 13/774,078, filed Feb. 22, 2013.
U.S. Appl. No. 13/774,193, filed Feb. 22, 2013.
U.S. Appl. No. 13/657,421, filed Oct. 22, 2012.
U.S. Appl. No. 13/341,337, filed Dec. 30, 2011.

* cited by examiner

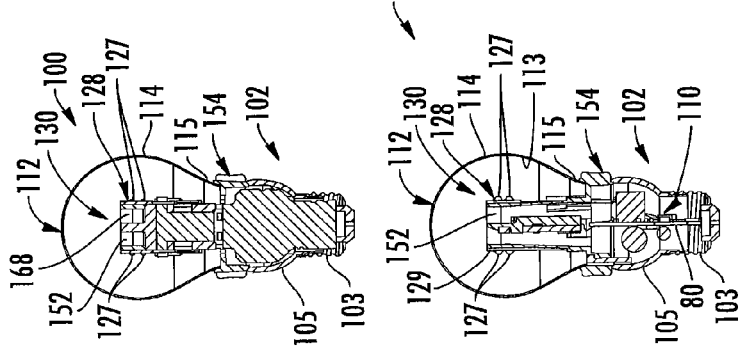
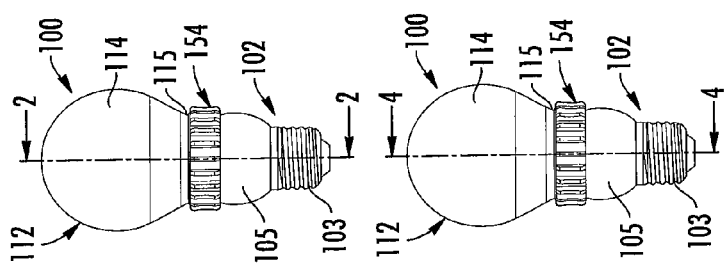

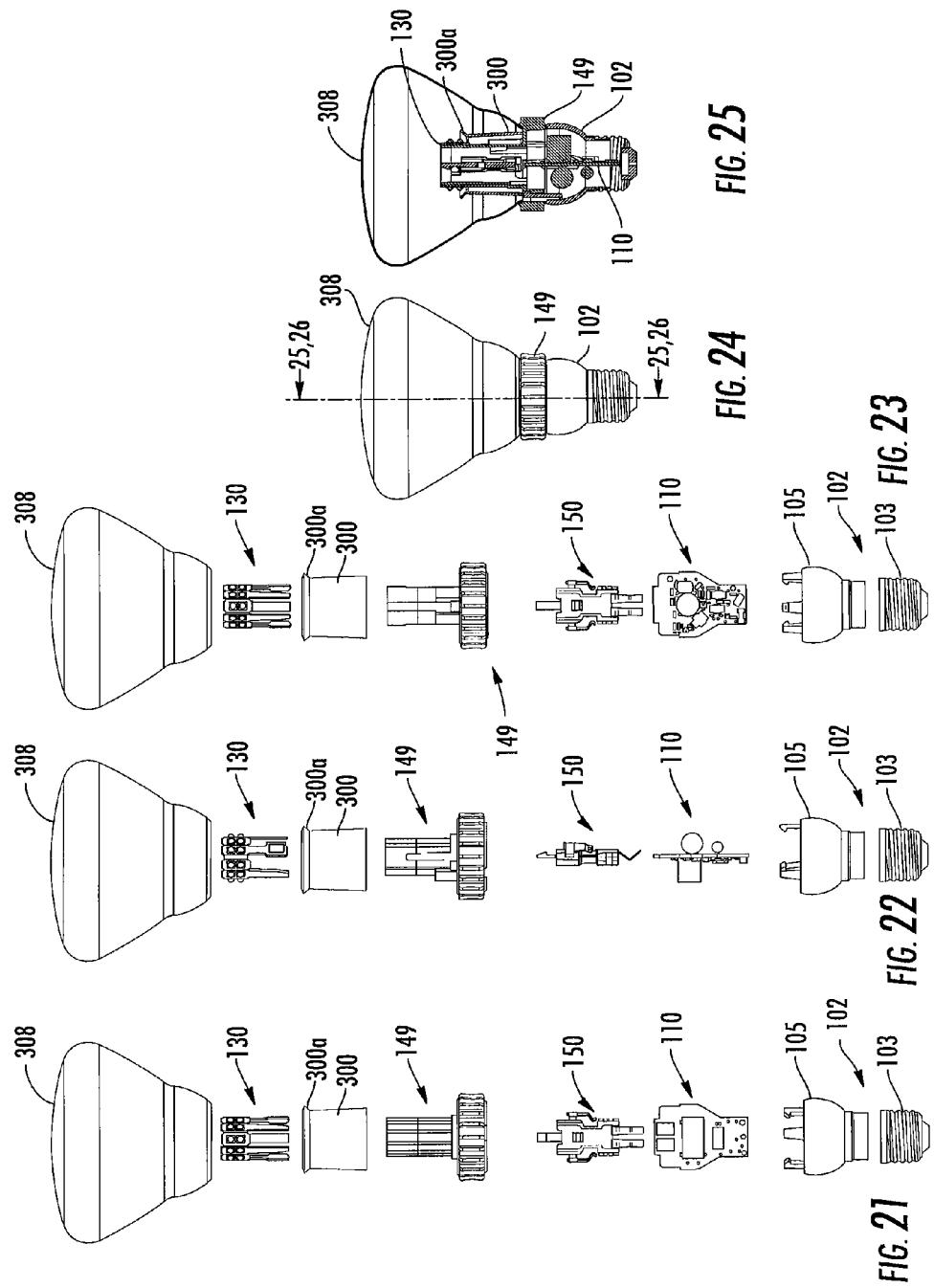

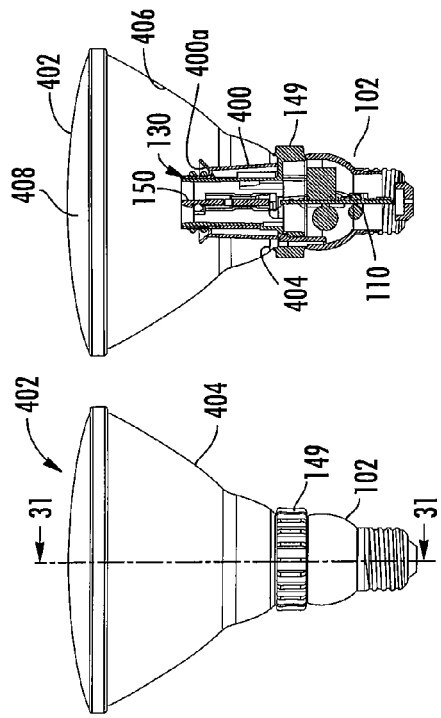
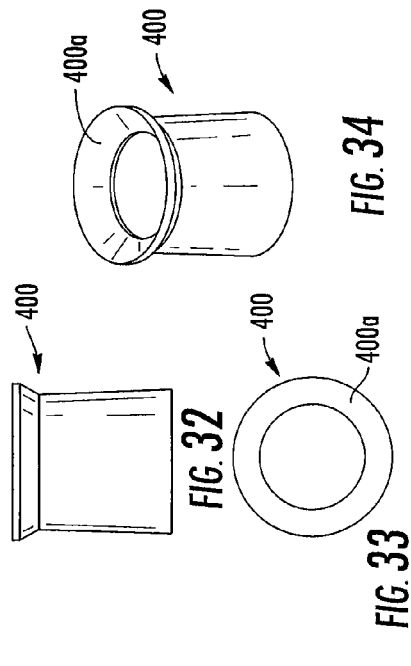
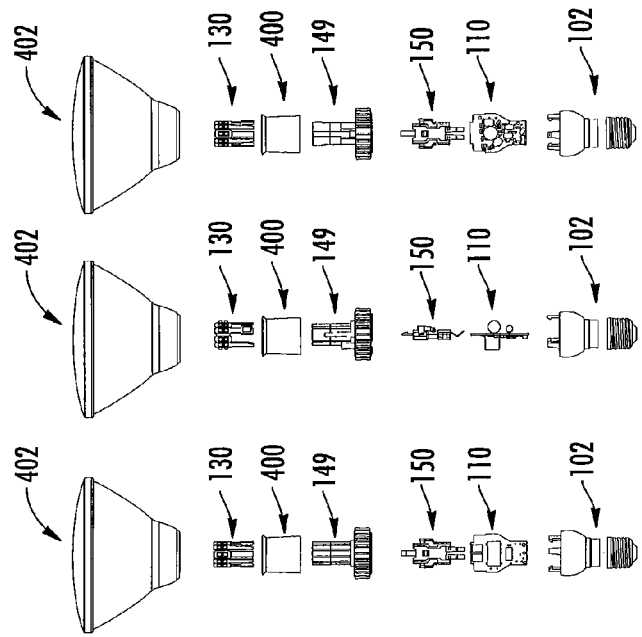
FIG. 31
FIG. 34
FIG. 30
FIG. 32
FIG. 33
FIG. 29
FIG. 28
FIG. 27

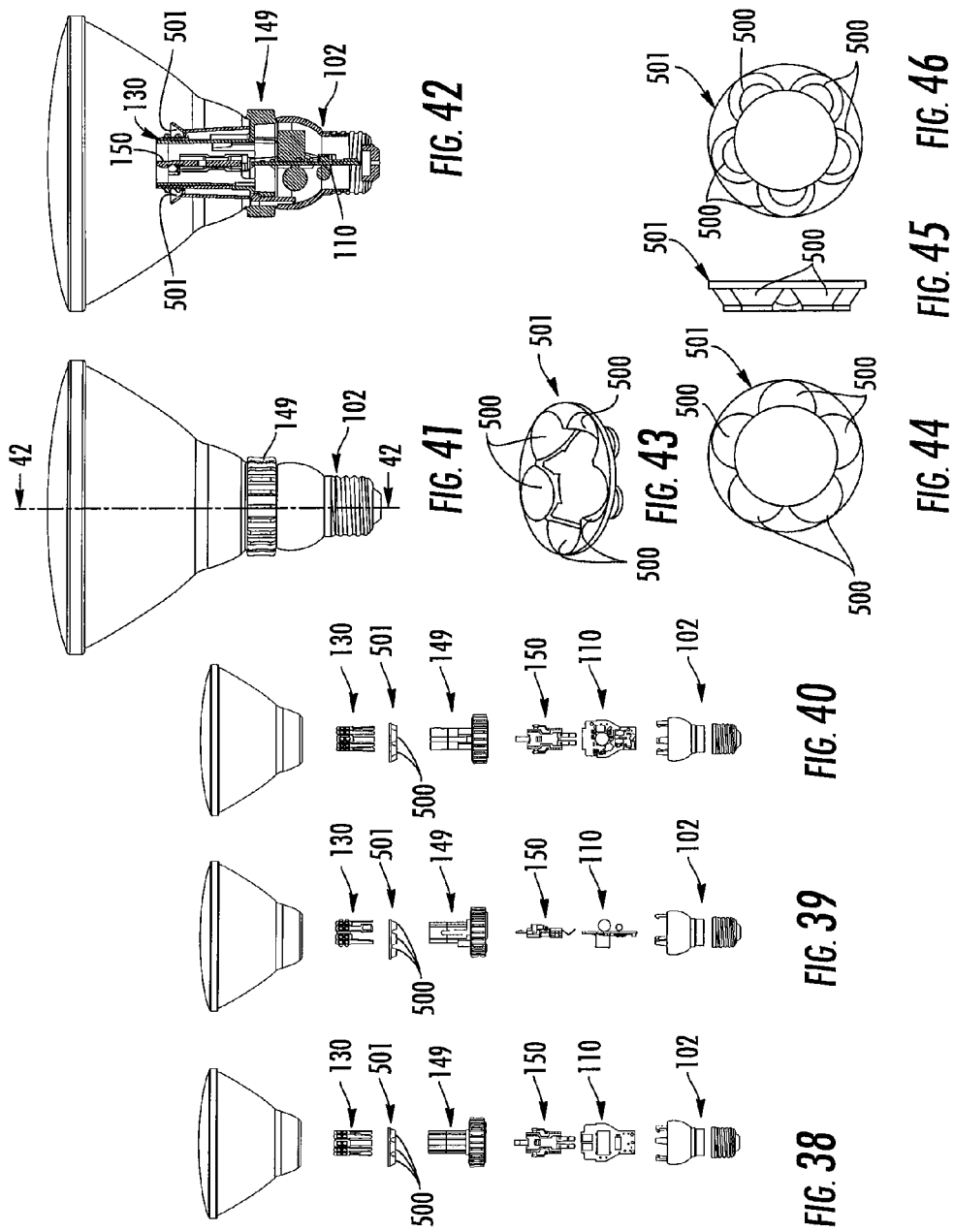

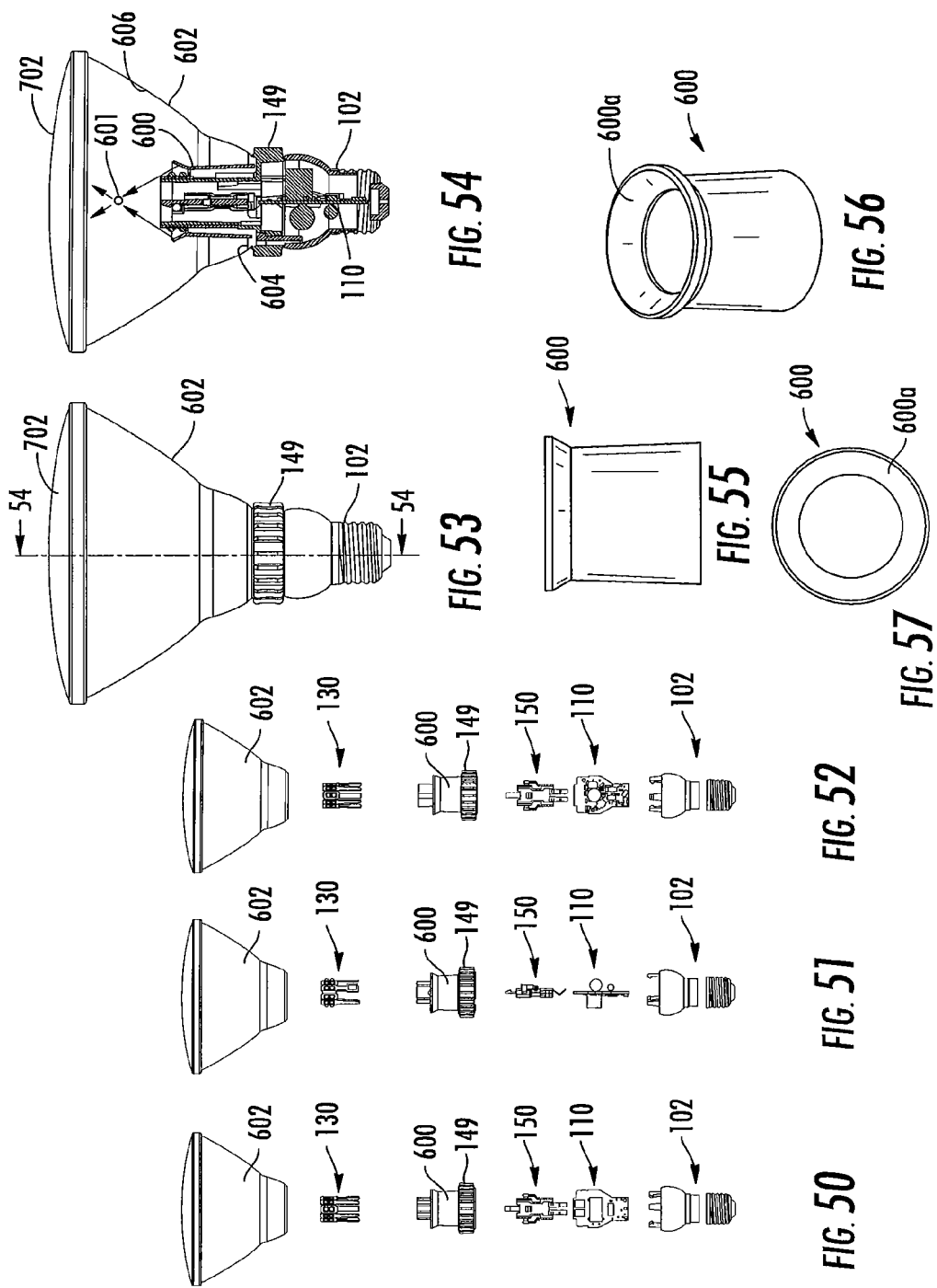

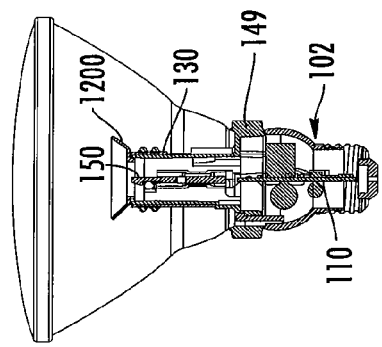
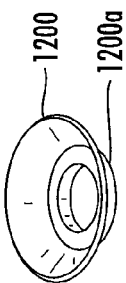
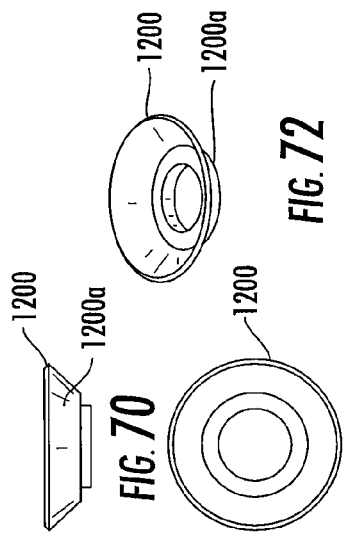
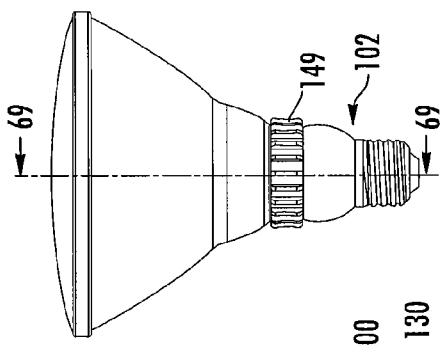
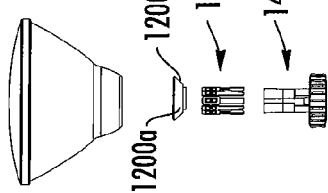
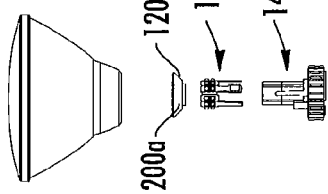
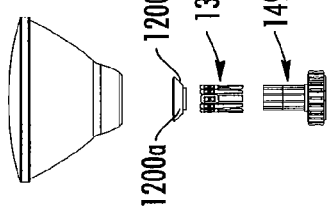
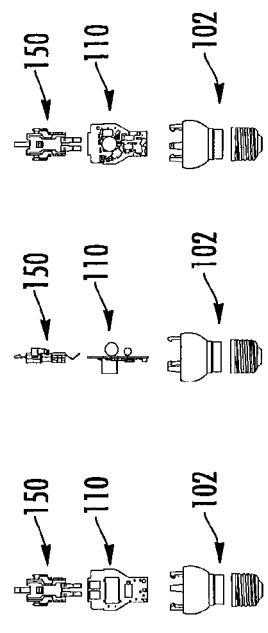

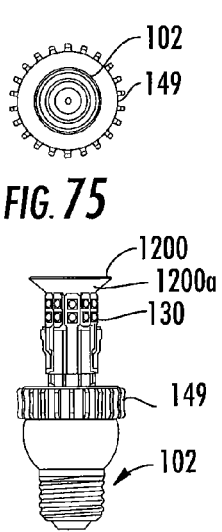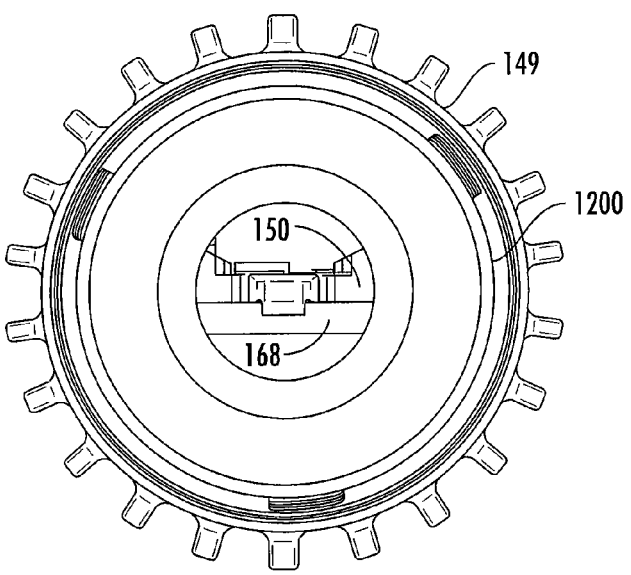
FIG. 75
FIG. 74
FIG. 73

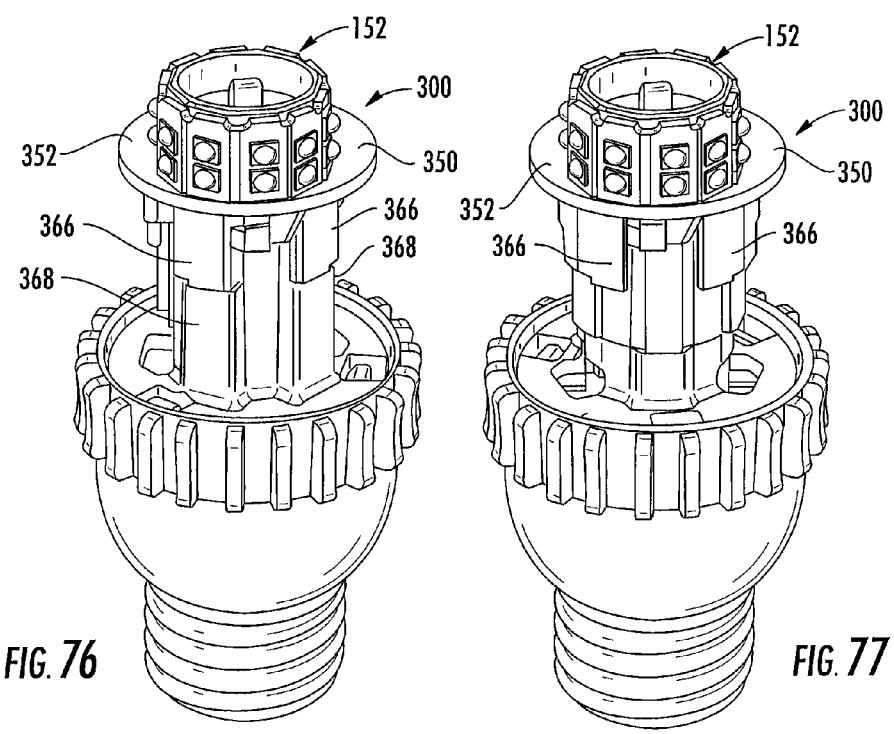
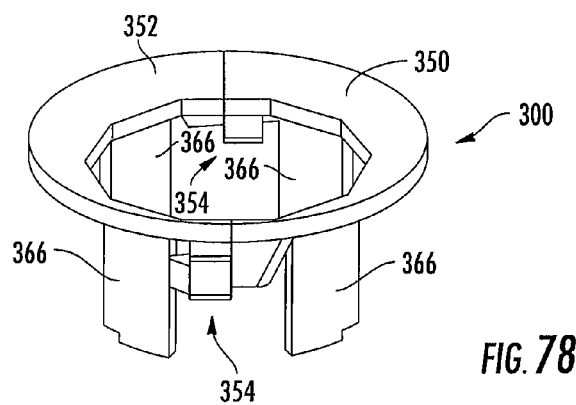

LED LAMP

This application is a continuation of U.S. application Ser. No. 13/774,078, as filed on Feb. 22, 2013, which is incorporated by reference herein in its entirety, which is a continuation-in-part (CIP) of U.S. application Ser. No. 13/467,670, as filed on May 9, 2012, which is incorporated by reference herein in its entirety, and which is a continuation-in-part (CIP) of U.S. application Ser. No. 13/446,759, as filed on Apr. 13, 2012, which is incorporated by reference herein in its entirety.

This application also claims benefit of priority under 35 U.S.C. §119(e) to the filing date of U.S. Provisional Application No. 61/738,668, as filed on Dec. 18, 2012, which is incorporated by reference herein in its entirety; and to the filing date of U.S. Provisional Application No. 61/712,585, as filed on Oct. 11, 2012, which is incorporated by reference herein in its entirety; and to the filing date of U.S. Provisional Application No. 61/716,818, as filed on Oct. 22, 2012, which is incorporated by reference herein in its entirety; and to the filing date of U.S. Provisional Application No. 61/670,686, as filed on Jul. 12, 2012, which is incorporated by reference herein in its entirety.

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature.

SUMMARY OF THE INVENTION

In one embodiment a lamp comprises an optically transmissive enclosure and a base. A tower extends from the base into the enclosure and supports an LED assembly in the optically transmissive enclosure. The LED assembly comprises a plurality of LEDs operable to emit light when energized through an electrical path from the base. The tower and the LED assembly are arranged such that the plurality of LEDs are disposed about the periphery of the tower in a band and face outwardly toward the enclosure to create a source of the light that appears as a glowing filament.

In one embodiment, a lamp comprises an optically transmissive enclosure and a base. An LED assembly is connected to the base and extends into the optically transmissive enclosure. The LED assembly comprises a plurality of LEDs operable to emit light when energized through an electrical path from the base. The tower and the LED assembly are arranged such that the plurality of LEDs are disposed about a longitudinal axis of the lamp in a band and face outwardly toward the enclosure to create a source of the light that is appears as a glow of a filament.

In one embodiment, a lamp comprises an optically transmissive enclosure and a base. A heat sink extends into the enclosure and supports an LED assembly in the optically transmissive enclosure. The LED assembly operates to emit light when energized through an electrical path from the base. The heat sink is thermally coupled to the LED assembly for transmitting heat from the LED assembly to the ambient environment where the heat sink and the LED assembly are arranged such that the LED assembly is disposed substantially in the optical center of the enclosure. The LED assembly comprises a plurality of LEDs disposed about the periphery of the heat sink.

In one embodiment, a lamp comprises an optically transmissive enclosure and a base. A heat sink supports an LED assembly and comprises a plurality of LEDs in the optically transmissive enclosure. The LED assembly operates to emit light when energized through an electrical path. The heat sink comprises a tower that extends into the enclosure along the longitudinal axis of the lamp and a heat dissipating portion that extends to the exterior of the lamp. The tower is thermally coupled to the LED assembly for transmitting heat from the LED assembly to the heat dissipating portion. The LED assembly has a three-dimensional shape where the LED assembly is mounted outside of the tower and the plurality of LEDs are supported to emit light in a plurality of different directions relative to the enclosure.

In one embodiment, a lamp comprises an optically transmissive enclosure and a base. An LED assembly is disposed in the optically transmissive enclosure operable to emit light when energized through an electrical path. A heat sink is thermally coupled to the LED assembly for transmitting heat from the LED assembly to the ambient environment. An electrical interconnect connects a conductor to the heat sink where the conductor is in the electrical path between the LED assembly and the base.

In one embodiment, a lamp comprises an optically transmissive enclosure and a base. An LED assembly is disposed in the optically transmissive enclosure operable to emit light when energized through an electrical path. A heat sink is thermally coupled to the LED assembly for transmitting heat from the LED assembly to the ambient environment. A clamping structure clamps the LED assembly to the heat sink.

In one embodiment, a lamp comprises a power supply and an LED assembly operable to emit light when energized through an electrical connection connected to the power supply. T connector comprises an electrical interconnect comprising a conductor for connecting the LED assembly and the power supply, the electrical interconnect comprises a connector for connecting to the lamp.

In one embodiment, a lamp comprises an enclosure having an optically transmissive exit surface. A LED assembly is disposed in the enclosure operable to emit light laterally when energized through an electrical connection. A heat sink is thermally coupled to the LED assembly for transmitting heat from the LED assembly to the ambient environment. A primary reflector is disposed inside of the enclosure such that light emitted by the LED assembly is reflected to form a beam of light at a desired beam angle.

In one embodiment, a lamp comprises an optically transmissive enclosure. An LED assembly is disposed in the center of the optically transmissive enclosure operable to emit light when energized through an electrical connection. The LED assembly comprises a plurality of LEDs comprising a large EPI area operated at a relatively low current. A heat sink is thermally coupled to the LED assembly for transmitting heat from the LED assembly to the ambient environment.

In one embodiment, a lamp comprises an optically transmissive enclosure having an opening and a base connected to the enclosure. A tower extends from the base into the enclosure and supports an LED assembly in the optically transmissive enclosure. The LED assembly comprises a plurality of LEDs operable to emit light when energized through an electrical path from the base. The LED assembly comprises a flat submount on which a plurality of LEDs are mounted, the flat substrate being bent into a three-dimensional shape and being mounted on a tower. The LED assembly and tower are dimensioned to fit in the opening. The LED assembly is arranged such that the plurality of LEDs are disposed about the periphery of the tower in a band and face outwardly toward the enclosure to create a source of the light that is appears as a glowing filament.

In one embodiment a method of making a lamp comprises providing an optically transmissive enclosure having an opening; providing a tower dimensioned to fit into the opening and to extend into the enclosure; mounting a plurality of LEDs on a flat substrate; bending the flat substrate into a three-dimensional shape; mounting the substrate on the tower; inserting the tower and substrate into the enclosure through the opening; and connecting a base to the enclosure;

The tower may comprise a portion of a heat sink for dissipating heat from the LED assembly. A second portion of the heat sink may extend to an exterior of the enclosure. The LED assembly may comprise a submount on which the plurality of LEDs are mounted. The submount may comprise at least one of a PCB, metal core board, lead frame and metal core printed circuit board. The submount may have a three-dimensional shape where a portion of the heat sink is inside of the submount and the plurality of LEDs are mounted on an outside surface of the submount. The submount may comprise a connector portion that couples the LED assembly to the heat sink and electrically couples the LED assembly to the electrical path. A tower may extend along the longitudinal axis of the lamp and the LED assembly may be mounted on the tower such that at least some of the LEDs of the plurality of LEDs emit light laterally. The plurality of LEDs may be positioned in a band about the tower such that a high intensity area of light produced from the plurality of LEDs appears as a glowing line of light when energized. The band may have a height and the tower may have a diameter where the height of the band, in the dimension along a longitudinal axis of the lamp, may be smaller than the diameter of the tower.

The electrical conductor may connect the LED assembly to lamp electronics in the base. The electrical conductor may comprise a first contact that is electrically coupled with the LED assembly and a second contact that is electrically coupled with the lamp electronics. A first contact coupling may be provided between the first contact and the LED assembly and a second contact coupling may be provided between the second contact and the lamp electronics. The electrical interconnect may comprise a body that retains the conductor and a second conductor where the conductor connects to one of an anode side or a cathode side of the LED assembly and the second conductor connects to the other one of the anode side or the cathode side of the LED assembly. The conductor may form a first LED-side contact and a first lamp electronics-side contact and the second conductor may form a second LED-side contact and a second lamp electronics-side contact. The conductor and the second conductor may extend through the body. The electrical interconnect may be inserted into the heat sink to create an electrical connection to the LED assembly. The electrical interconnect may comprise an alignment mechanism that is configured to position the conductor and the second conductor relative to corresponding electrical contacts of the LED assembly and the lamp electronics. The alignment mechanism may comprise a slot on one of the electrical interconnect and the heat sink that engages a mating slot on the other one of the electrical interconnect and the heat sink. The electrical interconnect may be secured to the heat sink by a snap fit connector. The snap-fit connector may comprise a deformable resilient finger on one of the electrical interconnect and the heat sink that engages an engagement member on the other one of the electrical interconnect and the heat sink. One of the deformable resilient finger and the engagement member may comprise a camming surface and a lock member. The first contact coupling may comprise a first resilient member that deforms to bias into engagement with a first contact on the LED assembly and the second contact coupling may comprise a second resilient member that deforms to bias into engagement with a first contact on the lamp electronics. A snap-fit connector may connect the base to the heat sink.

The clamping structure may comprise a pair of extensions on the LED assembly that engage mating receptacles formed on the heat sink. The LED assembly may comprise a submount on which a plurality of LEDs are mounted on an LED mounting area and the extensions may comprise portions of the submount that extend away from the LED mounting area. The extensions may be formed with camming surfaces that engage the receptacles to clamp the LED assembly on the heat sink. The LED assembly may have a three-dimensional shape having a first end and a second end. The engagement of the camming surfaces with the receptacles may move the first end of the LED assembly toward the second end of the LED assembly. The first end and the second end of the LED assembly may be moved toward one another such that the inner circumference of the LED assembly is reduced such that the LED assembly exerts a clamping force on the heat sink as the LED assembly is inserted on the heat sink. The clamping force may hold the LED assembly on the heat sink and ensure a tight surface-to-surface engagement between the LED assembly and the heat sink such that heat generated by the LED assembly is transferred to the heat sink. The clamping structure may comprise a camming structure for moving a first end of the LED assembly towards a second end of the LED assembly. The heat sink may comprise a heat conducting tower that is dimensioned and configured to make thermal contact with the LED assembly. The tower may extend along the longitudinal axis of the lamp and into the center of the enclosure. The tower may comprise an outer surface that is in surface to surface contact with an internal surface of the LED assembly. The tower may be thermally coupled to a heat dissipating portion that dissipates heat from the lamp to the ambient environment. The heat dissipating portion may extend from the interior of the enclosure to the exterior of the lamp. A plurality of heat dissipating members may be formed on the heat dissipating portion to facilitate heat transfer to the ambient environment.

The enclosure may be one of a PAR style enclosure and a BR style enclosure. The lamp may be an omnidirectional lamp. The primary reflector may reflect light generated by the LED assembly generally in a direction along a longitudinal axis of the lamp. The primary reflector may be one of an elliptical reflector and a parabolic reflector. The primary reflector may be one of a diffuse reflector and a specular reflector. The primary reflector may be made of one of a white highly reflective material and a translucent material. The primary reflector may surround the LED assembly. The primary reflector may be mounted on the heat sink. The primary reflector may be positioned such that light from the LED assembly that is directed primarily toward the base is reflected by the primary reflector out the exit surface. The primary reflector may comprise two portions that together surround the heat sink and connect to one another using a snap-fit connector. The snap-fit connector may comprise a deformable tang on one of the two portions that is received in a mating receptacle on the other one of the two portions. The primary reflector may comprise legs that are supported on the heat sink. The enclosure may have a reflective surface surrounding the primary reflector. A portion of the light generated by the LED assembly may not be reflected by the primary reflector and at least some of the light generated by the LED assembly may be reflected by the reflective surface of the enclosure. The LED assembly may comprise a plurality of LEDs where one primary reflector is provided for each LED of the plurality of LEDs. A reverse reflector may be provided that reflects light that is projected toward the exit surface of the lamp toward the primary reflector such that the light may be projected at the desired beam angle.

The lamp may comprise a boost converter topology power supply. The boost converter topology may convert from AC to DC with at least approximately 92% efficiency. The LED assembly may comprise 20 LEDs where each LED comprises four LED chips where each LED chip is a 3 volt LED chip. The LED assembly may have approximately 28.8 mm$^2$ of EPI area. The plurality of LEDs may be operated at approximately 107 mA/(mm$^2$ of EPI area). The LED assembly may comprise between approximately 15 and 40 mm$^2$ of EPI area operated in the range of approximately 200 and 75 mA/(mm$^2$ of EPI area). The LED assembly may comprise approximately 40 mm$^2$ of EPI area operated at approximately 75 mA/(mm$^2$ of EPI area). The LED assembly may comprise approximately 15 mm$^2$ of EPI area operated at approximately 200 mA/(mm$^2$ of EPI area). The LED assembly may comprise approximately 10 mm$^2$ of EPI area operated at approximately 300 mA/(mm$^2$ of EPI area). The LED assembly may comprise approximately 20 mm$^2$ of EPI area operated at approximately 150 mA/(mm$^2$ of EPI area). The lamp may have a total bulb power between approximately 9 and 11 watts and the heat sink may have an exposed surface area in the range of range of approximately 20-40 square centimeters. The lamp may have a total bulb power between approximately 11 watts and 17 watts and the heat sink may have an exposed surface area in the range of range of approximately 40-80 square centimeters. The loss of lumens due to heat build-up may be between approximately 15% and 20%. The LEDs may be operated at a junction temperature of between approximately 110° and 120°.

BRIEF DESCRIPTION OF THE DRAWINGS

FIG. 1 is a front view of an embodiment of a lamp of the invention.
FIG. 2 is a section view taken along line A-A of FIG. 1.
FIG. 3 is a side view of the lamp of FIG. 1.
FIG. 4 is a section view taken along line B-B of FIG. 3.
FIG. 5 is an exploded perspective view of the lamp of FIG. 1.
FIGS. 21 through 23 are exploded plan views of an alternate embodiment of the lamp of the invention at different orientations of the lamp.
FIG. 24 is a front view of the embodiment of the lamp of FIG. 21.
FIG. 25 is a section view taken along line B-B of FIG. 24.
FIGS. 27 through 29 are exploded plan views of an alternate embodiment of the lamp of the invention at different orientations of the lamp.
FIG. 30 is a front view of an embodiment of a lamp of FIG. 27.
FIG. 31 is a section view taken along line B-B of FIG. 30.
FIG. 32 is a side view of an embodiment of a reflector.
FIG. 33 is a top view of the reflector of FIG. 32.
FIG. 34 is a perspective view of the reflector of FIG. 32.
FIGS. 38 through 40 are exploded plan views of an alternate embodiment of the lamp of the invention at different orientations of the lamp.
FIG. 41 is a front view of the embodiment of the lamp of FIG. 38.
FIG. 42 is a section view taken along line B-B of FIG. 41.
FIG. 43 is a perspective view of an embodiment of a reflector.
FIG. 44 is a top view of the reflector of FIG. 43.
FIG. 45 is a side view of the reflector of FIG. 43.
FIG. 46 is a bottom view of the reflector of FIG. 43.

FIGS. 50 through 52 are exploded plan views of an alternate embodiment of the lamp of the invention at different orientations of the lamp.

FIG. 53 is a front view of the embodiment of the lamp of FIG. 50.

FIG. 54 is a section view taken along line B-B of FIG. 53.

FIG. 55 is a side view of an embodiment of a reflector.

FIG. 56 is a perspective view of the reflector of FIG. 55.

FIG. 57 is a top view of the reflector of FIG. 55.

FIGS. 65 through 67 are exploded plan views of an alternate embodiment of the lamp of the invention at different orientations of the lamp.

FIG. 68 is a front view of the embodiment of the lamp of FIG. 65.

FIG. 69 is a section view taken along line B-B of FIG. 68.

FIG. 70 is a side view of an embodiment of a reflector.

FIG. 71 is a top view of the reflector of FIG. 70.

FIG. 72 is a perspective view of the reflector of FIG. 70.

FIG. 73 is a top view showing the reflector and LED assembly and heat sink of the embodiment of FIG. 65-69.

FIG. 74 is a side view of the assembly of FIG. 73.

FIG. 75 is a bottom view of the assembly of FIG. 73.

FIG. 76 is a perspective view of an embodiment of a reflector, heat sink and base.

FIG. 77 is a perspective view of the embodiment of the reflector of FIG. 76, heat sink and base in a different orientation.

FIG. 78 is a perspective view of the reflector of FIG. 76.

DETAILED DESCRIPTION

Figure 6:
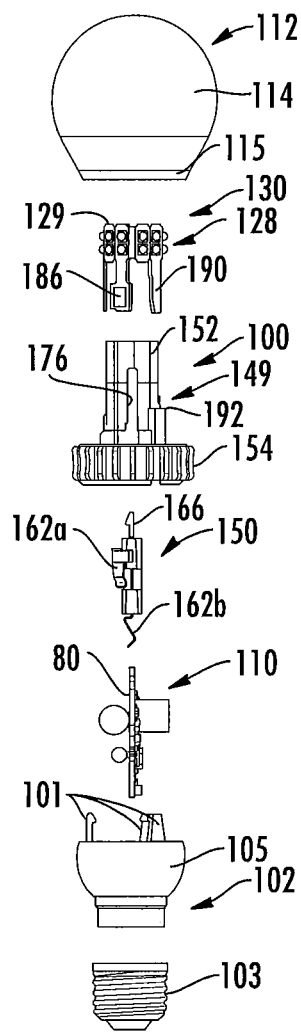
FIGS. 6 through 9 are exploded plan views of the lamp of FIG. 1 at different orientations of the lamp.
Figure 7:
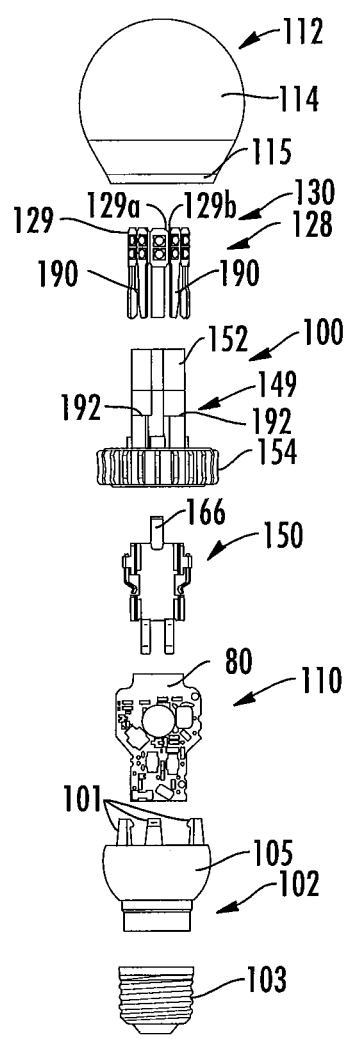
Figure 8:
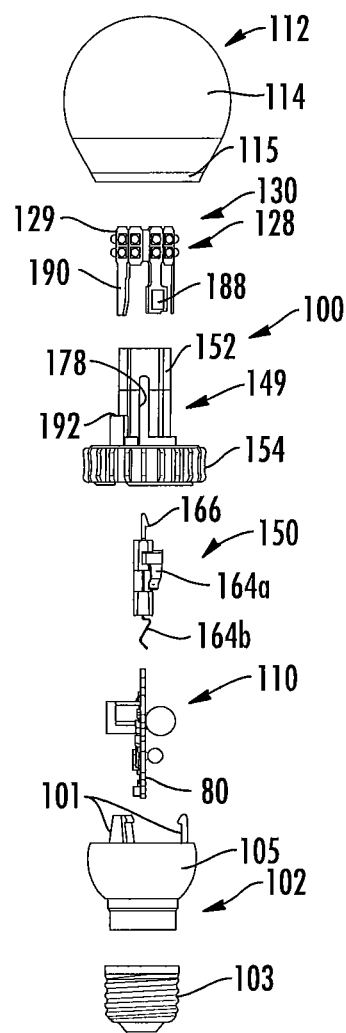
Figure 9:
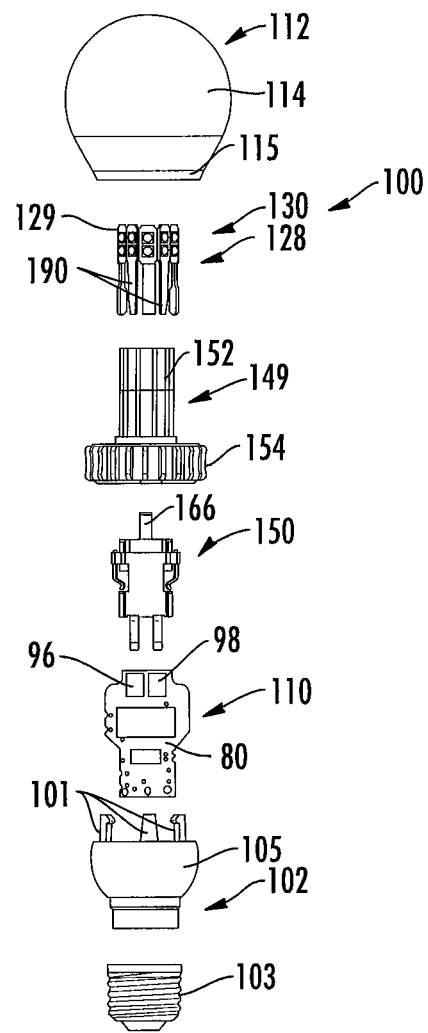
Figure 10:
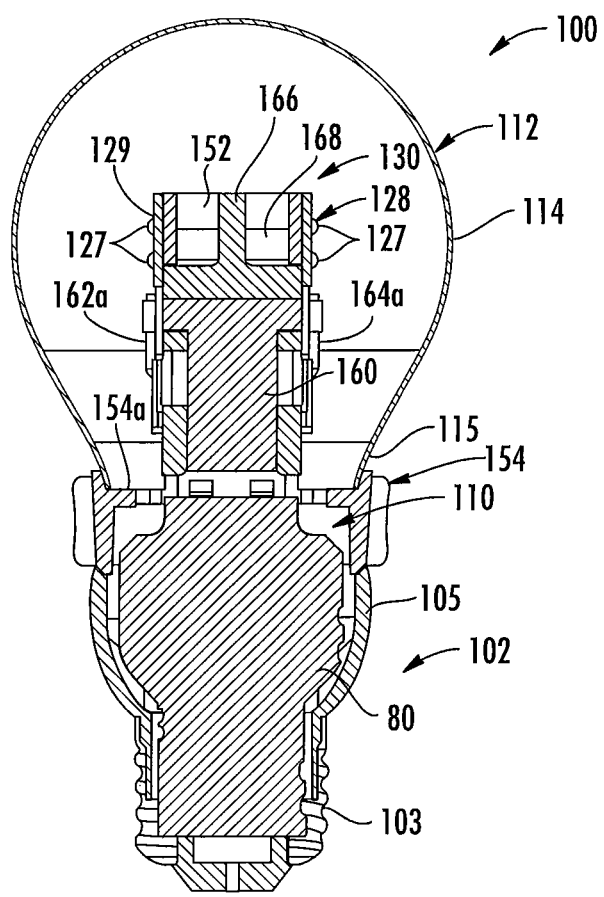
FIG. 10 is a section view similar to FIG. 2.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Embodiments of the present invention provide a solid-state lamp with centralized light emitters, more specifically, LEDs. Multiple LEDs can be used together, forming an LED array. The LEDs can be mounted on or fixed within the lamp in various ways. In at least some example embodiments, a submount is used. The LEDs are disposed at or near the central portion of the structural envelope of the lamp. Since the LED array may be configured in some embodiments to reside centrally within the structural envelope of the lamp, a lamp can be constructed so that the light pattern is not adversely affected by the presence of a heat sink and/or mounting hardware, or by having to locate the LEDs close to the base of the lamp. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

FIGS. 1 through 11 show a lamp, 100, according to some embodiments of the present invention. Lamp 100 may be used as an A-series lamp with an Edison base 102, more particularly; lamp 100 is designed to serve as a solid-state replacement for an A19 incandescent bulb. The Edison base 102 as shown and described herein may be implemented through the use of an Edison connector 103 and a plastic form. The LEDs 127 in the LED array 128 may comprise an LED die disposed in an encapsulant such as silicone, and LEDs which are encapsulated with a phosphor to provide local wavelength conversion, as will be described later when various options for creating white light are discussed. The LEDs 127 of LED array 128 are mounted on a submount 129 and are operable to emit light when energized through an electrical connection.

In the present invention the term "submount" is used to refer to the support structure that supports the individual LEDs or LED packages and in one embodiment comprises a printed circuit board or "PCB" although it may comprise other structures such as a lead frame extrusion or the like or combinations of such structures. In some embodiments, a driver or power supply may be included with the LED array on the submount. In some cases the driver may be formed by components on PCB 80. While a lamp having the size and form factor of a standard-sized household incandescent bulb is shown, the lamp may have other the sizes and form factors. For example, the lamp may be a PAR-style lamp such as a replacement for a PAR-38 incandescent bulb or a BR-style incandescent bulb.

Enclosure 112 is, in some embodiments, made of glass, quartz, borosilicate, silicate, polycarbonate, other plastic or other suitable material. The enclosure may be of similar shape to that commonly used in household incandescent bulbs. In some embodiments, the glass enclosure is coated on the inside with silica 113, providing a diffuse scattering layer that produces a more uniform far field pattern. The enclosure may also be etched, frosted or coated. Alternatively, the surface treatment may be omitted and a clear enclosure may be provided. The enclosure may also be provided with a shatter proof or shatter resistant coating. It should also be noted that in this or any of the embodiments shown here, the optically transmissive enclosure or a portion of the optically transmissive enclosure could be coated or impregnated with phosphor or a diffuser. The glass enclosure 112 may have a traditional bulb shape having a globe shaped main body 114 that tapers to a narrower neck 115.

A lamp base 102 such as an Edison base functions as the electrical connector to connect the lamp 100 to an electrical socket or other connector. Depending on the embodiment, other base configurations are possible to make the electrical connection such as other standard bases or non-traditional bases. Base 102 may include the electronics 110 for powering lamp 100 and may include a power supply and/or driver and form all or a portion of the electrical path between the mains and the LEDs. Base 102 may also include only part of the power supply circuitry while some smaller components reside on the submount. With the embodiment of FIG. 1, as with many other embodiments of the invention, the term "electrical path" can be used to refer to the entire electrical path to the LED array 128, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Electrical conductors run between the LED assembly 130 and the lamp base 102 to carry both sides of the supply to provide critical current to the LEDs 127 as will be described.

The LED assembly 130 may be implemented using a printed circuit board ("PCB") and may be referred by in some cases as an LED PCB. In some embodiments the LED PCB comprises the submount 129. The lamp 100 comprises a solid-state lamp comprising a LED assembly 130 with light emitting LEDs 127. Multiple LEDs 127 can be used together, forming an LED array 128. The LEDs 127 can be mounted on or fixed within the lamp in various ways. In at least some example embodiments, a submount 129 is used. The LEDs 127 in the LED array 128 include LEDs which may comprise an LED die disposed in an encapsulant such as silicone, and LEDs which may be encapsulated with a phosphor to provide local wavelength conversion, as will be described later when various options for creating white light are discussed. A wide variety of LEDs and combinations of LEDs may be used in the LED assembly 130 as described herein. The LEDs 127 of the LED array 128 are operable to emit light when energized through an electrical connection. An electrical path runs between the submount 129 and the lamp base 102 to carry both sides of the supply to provide critical current to the LEDs 127.

In some embodiments, a driver and/or power supply are included with the LED array 128 on the submount 129. In other embodiments the driver and/or power supply are included in the base 102 as shown. The power supply and drivers may also be mounted separately where components of the power supply are mounted in the base 102 and the driver is mounted with the submount 129 in the enclosure 112. Base 102 may include a power supply or driver and form all or a portion of the electrical path between the mains and the LEDs 127. The base 102 may also include only part of the power supply circuitry while some smaller components reside on the submount 129. In some embodiments any component that goes directly across the AC input line may be in the base 102 and other components that assist in converting the AC to useful DC may be in the glass enclosure 112. In one example embodiment, the inductors and capacitor that form part of the EMI filter are in the Edison base. Suitable power supplies and drivers are described in U.S. patent application Ser. No. 13/462,388 filed on May 2, 2012 and titled "Driver Circuits for Dimmable Solid State Lighting Apparatus" which is incorporated herein by reference in its entirety; U.S. patent application Ser. No. 12/775,842 filed on May 7, 2010 and titled "AC Driven Solid State Lighting Apparatus with LED String Including Switched Segments" which is incorporated herein by reference in its entirety; U.S. patent application Ser. No. 13/192,755 filed Jul. 28, 2011 titled "Solid State Lighting Apparatus and Methods of Using Integrated Driver Circuitry" which is incorporated herein by reference in its entirety; U.S. patent application Ser. No. 13/339,974 filed Dec. 29, 2011 titled "Solid-State Lighting Apparatus and Methods Using Parallel-Connected Segment Bypass Circuits" which is incorporated herein by reference in its entirety; U.S. patent application Ser. No. 13/235,103 filed Sep. 16, 2011 titled "Solid-State Lighting Apparatus and Methods Using Energy Storage" which is incorporated herein by reference in its entirety; U.S. patent application Ser. No. 13/360,145 filed Jan. 27, 2012 titled "Solid State Lighting Apparatus and Methods of Forming" which is incorporated herein by reference in its entirety; U.S. patent application Ser. No. 13/338,095 filed Dec. 27, 2011 titled "Solid-State Lighting Apparatus Including an Energy Storage Module for Applying Power to a Light Source Element During Low Power Intervals and Methods of Operating the Same" which is incorporated herein by reference in its entirety; U.S. patent application Ser. No. 13/338,076 filed Dec. 27, 2011 titled "Solid-State Lighting Apparatus Including Current Diversion Controlled by Lighting Device Bias States and Current Limiting Using a Passive Electrical Component" which is incorporated herein by reference in its entirety; and U.S. patent application Ser. No. 13/405,891 filed Feb. 27, 2012 titled "Solid-State Lighting Apparatus and Methods Using Energy Storage" which is incorporated herein by reference in its entirety.

The AC to DC conversion may be provided by a boost topology to minimize losses and therefore maximize conversion efficiency. The boost supply is connected to high voltage LEDs operating at greater than 200V. Other embodiments are possible using different driver configurations, or a boost supply at lower voltages.

In some embodiments a gas movement device may be provided within the enclosure 112 to increase the heat transfer between the LEDs 127 and LED assembly 130 and heat sink 149. The movement of the gas over the LED assembly 130 moves the gas boundary layer on the components of the LED assembly 130. In some embodiments the gas movement device comprises a small fan. The fan may be connected to the power source that powers the LEDs 127. While the gas movement device may comprise an electric fan, the gas movement device may comprise a wide variety of apparatuses and techniques to move air inside the enclosure such as a rotary fan, a piezoelectric fan, corona or ion wind generator, synjet diaphragm pumps or the like.

The LED assembly 130 comprises a submount 129 arranged such that the LED array 128 is substantially in the center of the enclosure 112 such that the LED's 127 are positioned at the approximate center of enclosure 112. As used herein the terms "center of the enclosure" and "optical center of the enclosure" refers to the vertical position of the LEDs in the enclosure as being aligned with the approximate largest diameter area of the globe shaped main body 114. "Vertical" as used herein means along the longitudinal axis of the bulb where the longitudinal axis extends from the base to the free end of the bulb as represented for example by line A-A in FIG. 1. In one embodiment, the LED array 128 is arranged in the approximate location that the visible glowing filament is disposed in a standard incandescent bulb. The terms "center of the enclosure" and "optical center of the enclosure" do not necessarily mean the exact center of the enclosure and are used to signify that the LEDs are located along the longitudinal axis of the lamp at a position between the ends of the enclosure near a central portion of the enclosure.

Figure 19:
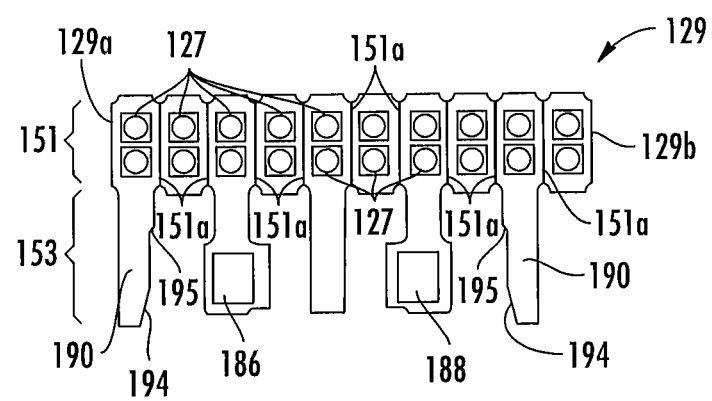
FIG. 19 is a side view of an embodiment of a MCPCB submount usable in embodiments of the lamp of the invention.
Figure 20:
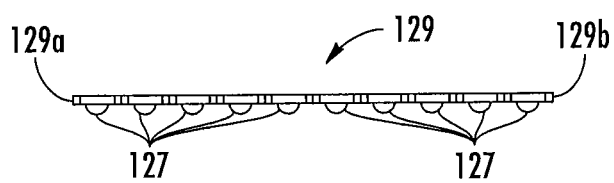
FIG. 20 is an end view of the embodiment of a MCPCB submount of FIG. 19.
Figure 26:
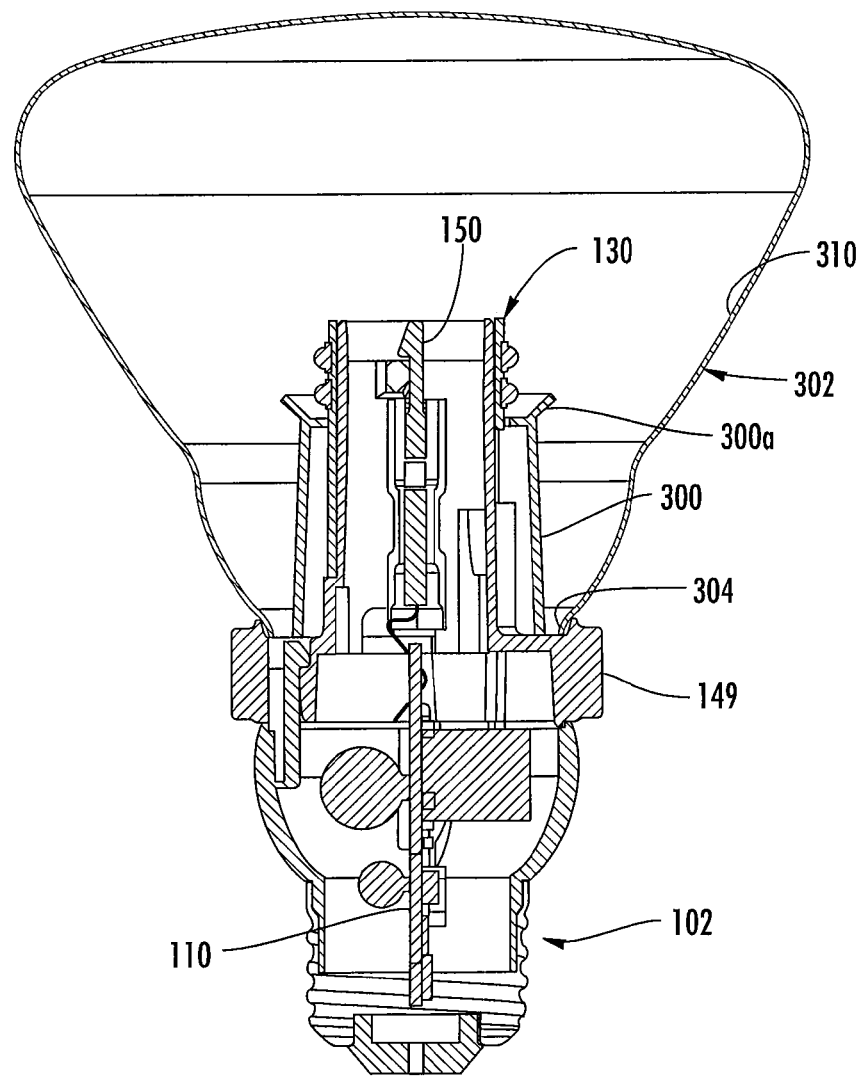
FIG. 26 is a more detailed section view taken along line B-B of FIG. 24.
Figure 37:
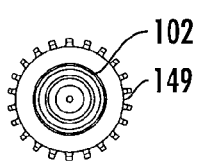
FIG. 37 is a bottom view of the assembly of FIG. 35.
Figure 36:
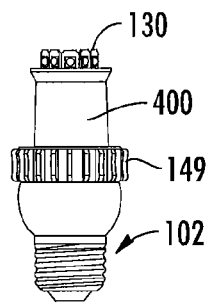
FIG. 36 is a side view of the assembly of FIG. 35.
Figure 35:
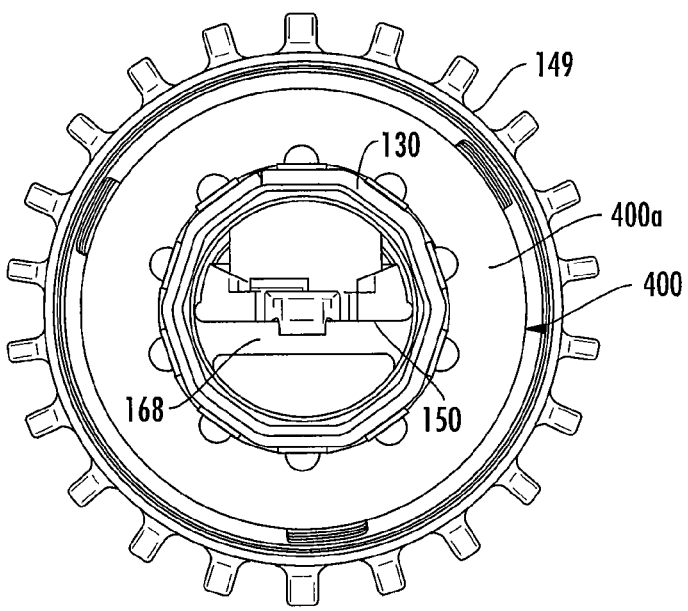
FIG. 35 is a top view showing the reflector and LED assembly and heat sink of the embodiment of FIG. 27-32.
Figure 49:
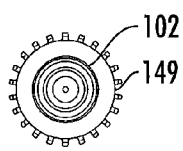
FIG. 49 is a bottom view of the assembly of FIG. 47.
Figure 48:
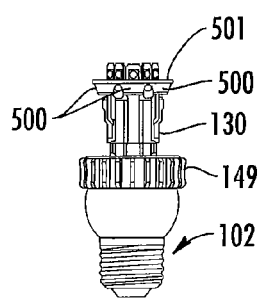
FIG. 48 is a side view of the assembly of FIG. 47.
Figure 47:
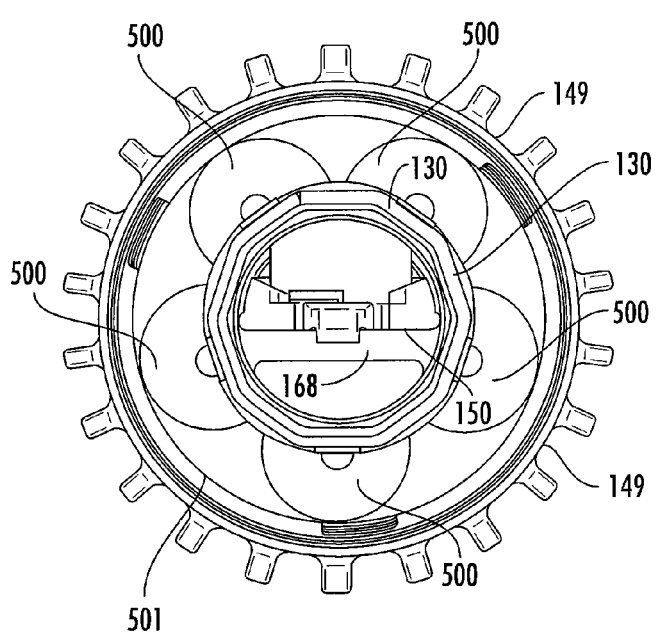
FIG. 47 is a top view showing the reflector and LED assembly and heat sink of the embodiment of FIG. 38-42.
Figure 60:
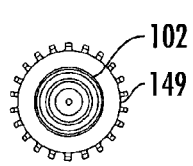
FIG. 60 is a bottom view of the assembly of FIG. 58.
Figure 59:
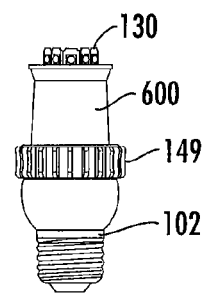
FIG. 59 is a side view of the assembly of FIG. 58.
Figure 58:
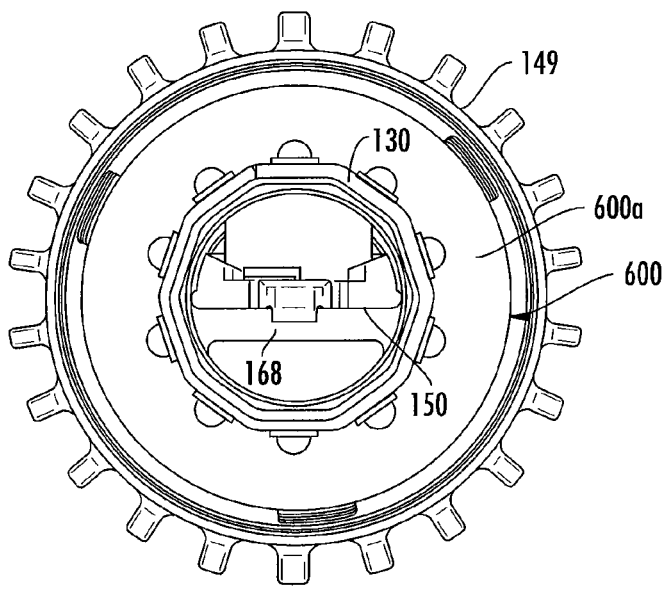
FIG. 58 is a top view showing the reflector and LED assembly and heat sink of the embodiment of FIG. 50-54.

Referring to FIGS. 19 and 20, in some embodiments, the submount 129 may comprise a PCB, metal core board, metal core printed circuit board or other similar structure. The submount may be made of a thermally conductive material. In some embodiments the thickness of the submount may be about 1 mm-2.0 mm thick. For example the thickness may be about 1.6 mm. In other embodiments a copper or copper based lead frame may be used. Such a lead frame may have a thickness of about 0.25-1.0 mm, for example, 0.25 mm or 0.5 mm. In other embodiments, other dimensions including thicknesses are possible. The entire area of the submount 129 may be thermally conductive such that the entire LED assembly 130 transfers heat to the heat sink 149. The submount 129 comprises a first LED mounting portion 151 that functions to mechanically and electrically support the LEDs 127 and a second connector portion 153 that functions to provide thermal, electrical and mechanical connections to the LED assembly 130. The submount 129 may be bent into the configuration of the LED assembly 130 as shown in the figures. In one embodiment, the enclosure and base are dimensioned to be a replacement for an ANSI standard A19 bulb such that the dimensions of the lamp 100 fall within the ANSI standards for an A19 bulb. The dimensions may be different for other ANSI standards including, but not limited to, A21 and A23 standards. While specific reference has been made with respect to an A-series lamp with an Edison base 102 the structure and assembly method may be used on other lamps such as a PAR-style lamp such as a replacement for a PAR-38 incandescent bulb or a BR-style lamp. In other embodiments, the LED lamp can have any shape, including standard and non-standard shapes.

In some embodiments, the LED lamp 100 is equivalent to a 60 Watt incandescent light bulb. In one embodiment of a 60 Watt equivalent LED bulb, the LED assembly 130 comprises an LED array 128 of 20 XLamp® XT-E High Voltage white LEDs manufactured by Cree, Inc., where each XLamp® XT-E LED has a 46 V forward voltage and includes 16 DA LED chips manufactured by Cree, Inc. and configured in series. The XLamp® XT-E LEDs may be configured in four parallel strings with each string having five LEDs arranged in series, for a total of greater than 200 volts, e.g. about 230 volts, across the LED array 128. In another embodiment of a 60 Watt equivalent LED bulb, 20 XLamp® XT-E LEDs are used where each XT-E has a 12 V forward voltage and includes 16 DA LED chips arranged in four parallel strings of four DA chips arranged in series, for a total of about 240 volts across the LED array 128 in this embodiment. In some embodiments, the LED lamp 100 is equivalent to a 40 Watt incandescent light bulb. In such embodiments, the LED array 128 may comprise 10 XLamp® XT-E LEDs where each XT-E includes 16 DA LED chips configured in series. The 10 46V XLamp® XT-E® LEDs may be configured in two parallel strings where each string has five LEDs arranged in series, for a total of about 230 volts across the LED array 128. In other embodiments, different types of LEDs are possible, such as XLamp® XB-D LEDs manufactured by Cree, Inc. or others. Other arrangements of chip on board LEDs and LED packages may be used to provide LED based light equivalent to 40, 60 and/or greater other watt incandescent light bulbs, at about the same or different voltages across the LED array 128.

In one embodiment, the LED assembly 130 has a maximum outer dimension that fits into the open neck 115 of the enclosure 112 during the manufacturing process and an internal dimension that is at least as wide as the width or diameter of the heat conducting portion 152 of heat sink 149. In some embodiments the LED assembly 130 and heat sink 149 have a cylindrical shape such that the relative dimensions of the heat sink, LED assembly and the neck may be described as diameters. In one embodiment, the diameter of the LED assembly may be approximately 20 mm. In other embodiments some or all of these components may be other than cylindrical or round in cross-section. In such arrangements the major dimensions of these elements may have the dimensional relationships set forth above. In other embodiments, the LED assembly 130 can have different cross-sectional shapes, such as triangular, square and/or other polygonal shapes with or without curved surfaces.

The base 102 comprises an electrically conductive Edison screw 103 for connecting to an Edison socket and a housing portion 105 connected to the Edison screw. The Edison screw 103 may be connected to the housing portion 105 by adhesive, mechanical connector, welding, separate fasteners or the like. The housing portion 105 may comprise an electrically insulating material such as plastic. Further, the material of the housing portion 105 may comprise a thermally conductive material such that the housing portion 105 may form part of the heat sink structure for dissipating heat from the lamp 100. The housing portion 105 and the Edison screw 103 define an internal cavity for receiving the electronics 110 of the lamp including the power supply and/or drivers or a portion of the electronics for the lamp. The lamp electronics 110 are electrically coupled to the Edison screw 103 such that the electrical connection may be made from the Edison screw 103 to the lamp electronics 110. The base 102 may be potted to physically and electrically isolate and protect the lamp electronics 110. The lamp electronics 110 include a first contact pad 96 and a second contact pad 98 that allow the lamp electronics 110 to be electrically coupled to the LED assembly 130 in the lamp as will hereinafter be described. Contact pads 96 and 98 may be formed on printed circuit board 107 which includes the power supply, including large capacitor and EMI components that are across the input AC line along with the driver circuitry as described herein.

Any aspect or features of any of the embodiments described herein can be used with any feature or aspect of any other embodiments described herein or integrated together or implemented separately in single or multiple components. The steps described herein may be performed in an automated assembly line having rotary tables or other conveyances for moving the components between assembly stations.

In some embodiments, the submount 129 of the LED assembly 130 may comprise a lead frame made of an electrically conductive material such as copper, copper alloy, aluminum, steel, gold, silver, alloys of such metals, thermally conductive plastic or the like. In other embodiments, the submount comprises a PCB such as a metal core PCB as shown in FIGS. 19 and 20. In one embodiment, the exposed surfaces of the submount 129 may be coated with silver or other reflective material to reflect light inside of enclosure 112 during operation of the lamp. The submount may comprise a series of anodes and cathodes arranged in pairs for connection to the LEDs 127. In the illustrated embodiment 20 pairs of anodes and cathodes are shown for an LED assembly having 20 LEDs 127; however, a greater or fewer number of anode/cathode pairs and LEDs may be used. Moreover, more than one submount may be used to make a single LED assembly 130. For example, two submounts 129 may be used to make an LED assembly 130 having twice the number of LEDs as a single lead frame.

Connectors or conductors such as traces connect the anode from one pair to the cathode of the adjacent pair to provide the electrical path between the anode/cathode pairs during operation of the LED assembly 130. In a lead frame structure tie bars are also typically provided to hold the first portion of the lead frame to the second portion of the lead frame and to maintain the structural integrity of the lead frame during manufacture of the LED assembly 129. The tie bars are cut from the finished LED assembly and perform no function during operation of the LED assembly 130.

The submount 129 also comprises connector portion 153 that functions to couple the LED assembly 130 to the heat sink 149 such that heat may be dissipated from the LED assembly; to mechanically couple the LED assembly 130 to the heat sink 149; and to electrically couple the LED assembly 130 to the electrical path. The submount 129 may have a variety of shapes, sizes and configurations.

The lead frame may be formed by a stamping process and a plurality of lead frames may be formed in a single strip or sheet or the lead frames may be formed independently. In one method, the lead frame is formed as a flat member and is bent into a suitable three-dimensional shape such as a cylinder, sphere, polyhedra or the like to form LED assembly 130. Because the lead frame is made of thin bendable material, and the anodes and cathodes may be positioned on the lead frame in a wide variety of locations, and the number of LEDs may vary, the lead frame may be configured such that it may be bent into a wide variety of shapes and configurations.

An LED or LED package containing at least one LED 127 is secured to each anode and cathode pair where the LED/LED package spans the anode and cathode. The LEDs/LED packages may be attached to the submount by soldering. In a lead frame arrangement once the LEDs/LED packages are attached, the tie bars may be removed because the LED packages hold the first portion of the lead frame to the second portion of the lead frame.

In some embodiments of a lead frame submount, separate stiffeners or supports (not shown) may be provided to hold the lead frame together. The supports may comprise non-conductive material attached between the anode and cathode pairs to secure the lead frame together. The supports may comprise insert molded or injection molded plastic members that tie the anodes and cathodes together. The lead frame may be provided with pierced areas that receive the supports to provide holds that may be engaged by the supports. For example, the areas may comprise through holes that receive the plastic flow during a molding operation. The supports may also be molded or otherwise formed separately from the lead frame and attached to the lead frame in a separate assembly operation such as by using a snap-fit connection, adhesive, fasteners, a friction fit, a mechanical connection or the like. The plastic material extends through the pierced areas to both sides of the lead frame such that the plastic material bridges the components of the lead from to hold the components of the lead frame together after the tie bars are cut. The supports on the outer side of the lead frame (the term "outer" as used herein is the side of the lead frame to which the LEDs are attached) comprises a minimum amount of plastic material such that the outer surface of the lead frame is largely unobstructed by the plastic material. The plastic material should avoid the mounting areas for the LEDs such that the LEDs have an unobstructed area at which the LEDs may be attached to the lead frame. On the inner side of the lead frame (the term "inner" as used herein is the side of the lead frame opposite the side to which the LEDs are attached) the application of the plastic material may mirror the size and shape of the supports on the outer side; however, the supports on the inner side does need to be as limited such that the supports may comprise larger plastic areas and a greater area of the lead frame may be covered. The plastic material extends over larger areas of the inner side of the lead frame such that the plastic provides structural support for the lead frame.

Further, a first plastic overhang is provided on a first lateral end of the lead frame and a second plastic overhang is provided on a second lateral end of the lead frame. Because, in one embodiment the flat lead frame is bent to form a three-dimensional LED assembly, it may be necessary to electrically isolate the two ends of the lead frame from one another in the assembled LED assembly where the two ends have different potentials. The lead frame may be bent to form a cylindrical LED assembly where the lateral edges and of the lead frame are brought in close proximity relative to one another. The plastic overhangs are arranged such that the two edges of the lead frame are physically separated and electrically insulated from one another by the overhangs. The overhangs are provided along a portion of the two edges of the lead frame; however, the plastic insulating overhangs may extend over the entire free ends of the lead frame and the length and thickness of the overhangs depends upon the amount of insulation required for the particular application.

In addition to electrically insulating the edges of the lead frame, the plastic overhangs may be used to join the edges of the lead frame together in the three dimensional LED assembly. One of the overhangs may be provided with a first connector or connectors that mates with a second connector or connectors provided on the second overhang. The first connectors may comprise a male or female member and the second connectors may comprise a mating female or male member. Because the overhangs are made of plastic the connectors may comprise deformable members that create a snap-fit connection. The flat lead frame may be bent to have the generally cylindrical configuration as shown where the side edges are brought into close proximity to one another.

The mating connectors formed on the first overhang and second overhang may be engaged with one another to hold the lead frame in the final configuration.

Figure 16:
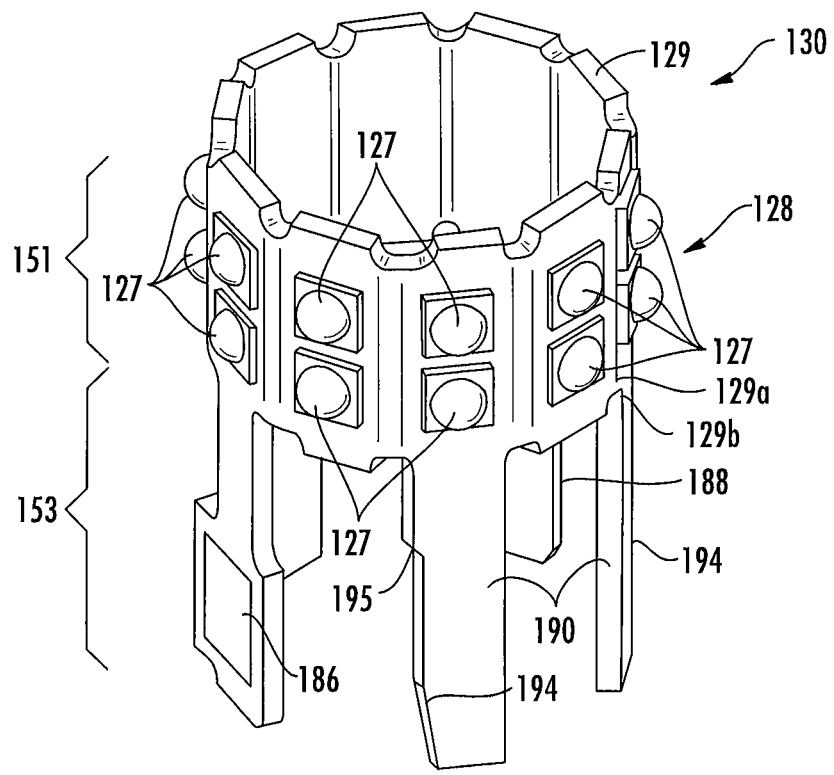
FIG. 16 is a perspective view of the LED assembly of FIG. 1.

In another embodiment of LED assembly 130 the submount 129 may comprise a metal core board such as a metal core printed circuit board (MCPCB) as shown, for example, in FIGS. 16, 19 and 20. The metal core board comprises a thermally and electrically conductive core made of aluminum or other similar pliable metal material. The core is covered by a dielectric material such as polyimide. Metal core boards allow traces to be formed therein. In one method, the core board is formed as a flat member and is bent into a suitable shape such as a cylinder, sphere, polyhedra or the like. Because the core board is made of thin bendable material and the anodes and cathodes may be positioned in a wide variety of locations, and the number of LED packages may vary, the metal core board may be configured such that it may be bent into a wide variety of shapes and configurations.

In one embodiment the core board is formed as a flat member having a first LED mounting portion 151 on which the LEDs/LED packages containing LEDs 127 are mounted. The first portion 151 may be divided into sections by thinned areas or score lines 151a. The LEDs/LED packages are located on the sections such that the core board may be bent along the score lines to form the planar core board into a variety of three-dimensional shapes where the shape is selected to project a desired light pattern from the lamp 100.

In another embodiment of the LED assembly 130 the submount 129 comprises a hybrid of a metal core board and lead frame. The metal core board forms the LED mounting portion 151 on which the LED packages containing LEDs 127 are mounted where the back side of the metal core board may be mechanically coupled to a lead frame structure. The lead frame structure forms the connector portion 153. Both the lead frame and the metal core board may be bent into the various configurations as discussed herein. The metal core board may be provided with score lines or reduced thickness areas to facilitate the bending of the core board. The LED assembly may also comprise a PCB made with FR4 and thermal vias rather than the metal core board where the thermal vias are then connected to the lead frame structure.

In another embodiment of LED assembly 130 the submount 129 may comprise an extruded submount which may be formed of aluminum or copper or other similar material. A flex circuit or board may be mounted on the extruded submount that supports LEDs 127. The extruded submount may comprise a variety of shapes such as previously described.

The submount 129 may be bent or folded such that the LEDs 127 provide the desired light pattern in lamp 100. In one embodiment the submount 129 is bent into a cylindrical shape as shown in the figures. The LEDs 127 are disposed about the axis of the cylinder such that light is projected outward. In a lead frame configuration, the lead frame may be bent at the connectors and in a metal core board configuration the core board may be bent at thinned score to form the three-dimensional LED assembly 130. The LEDs 127 may be arranged around the perimeter of the LED assembly to project light radially.

Because the submount 129 is pliable and the LED placement on the substrate may be varied, the submount may be formed and bent into a variety of configurations. For example one of the LEDs 127 may be angled toward the bottom of the LED assembly 130 and another of the LEDs 127 may be angled toward the top of the LED assembly 130 with the remaining LEDs projecting light radially from a cylindrical LED assembly 130. LEDs typically project light over less than 180 degrees such that tilting selected ones of the LEDs ensures that a portion of the light is projected toward the bottom and top of the lamp. Some LEDs project light through an angle of 120 degrees. By angling selected ones of the LEDs approximately 30 degrees relative to the axis of the LED assembly 130 the light projected from the cylindrical array will project light over 360 degrees. The angles of the LEDs and the number of LEDs may be varied to create a desired light pattern. For example, the figures show an embodiment of a two tiered LED assembly 130 where each tier comprises a series of a plurality of LEDs 127 arranged around the perimeter of the cylinder. While a two tiered LED assembly is shown the LED assembly may comprise one tier, three tiers or additional tiers of LEDs where each tier comprises a series of a plurality of LEDs 127 arranged around the perimeter of the cylinder. Selected ones of the LEDs may be angled with respect to the LED array to project a portion of the light along the axis of the cylindrical LED assembly toward the top and bottom of the LED assembly. The LED assembly may be shaped other than as a cylinder such as a polyhedron, a helix or double helix with two series of LED packages each arranged in series to form a helix shape. In the illustrated embodiments the submount is formed to have a generally cylindrical shape; however, the substrate may have a generally triangular cross-sectional shape, a hexagonal cross-sectional shape, or any polygonal shape or even more complex shapes.

The LED assembly 130, whether made of a lead frame submount, metal core board submount, a hybrid combination of metal core board/lead frame submount, a PCB made with FR4/lead frame submount or an extruded submount, may be formed to have any of the configurations shown and described herein or other suitable three-dimensional geometric shape. The LED assembly 130 may be advantageously bent or formed into any suitable three-dimensional shape. A "three-dimensional" LED assembly as used herein and as shown in the drawings means an LED assembly where the substrate comprises mounting surfaces for different ones of the LEDs that are in different planes such that the LEDs mounted on those mounting surfaces are also oriented in different planes. In some embodiments the planes are arranged such that the LEDs are disposed over a 360 degree range. The substrate may be bent from a flat configuration, where all of the LEDs are mounted in a single plane on a generally planar substrate, into a three-dimensional shape where different ones of the LEDs and LED mounting surfaces are in different planes.

As previously mentioned, the submount in a lamp according to embodiments of the invention can optionally include the power supply or driver or some components for the power supply or driver for the LED array. In some embodiments, the LEDs can actually be powered by AC. Various methods and techniques can be used to increase the capacity and decrease the size of a power supply in order to allow the power supply for an LED lamp to be manufactured more cost-effectively, and/or to take up less space in order to be able to be built on a submount. For example, multiple LED chips used together can be configured to be powered with a relatively high voltage. Additionally, energy storage methods can be used in the driver design. For example, current from a current source can be coupled in series with the LEDs, a current control circuit and a capacitor to provide energy storage. A voltage control circuit can also be used. A current source circuit can be used together with a current limiter circuit configured to limit a current through the LEDs to less than the current produced by the current source circuit. In the latter case, the power supply can also include a rectifier circuit having an input coupled to an input of the current source circuit.

Some embodiments of the invention can include a multiple LED sets coupled in series. The power supply in such an embodiment can include a plurality of current diversion circuits, respective ones of which are coupled to respective nodes of the LED sets and configured to operate responsive to bias state transitions of respective ones of the LED sets. In some embodiments, a first one of the current diversion circuits is configured to conduct current via a first one of the LED sets and is configured to be turned off responsive to current through a second one of the LED sets. The first one of the current diversion circuits may be configured to conduct current responsive to a forward biasing of the first one of the LED sets and the second one of the current diversion circuit may be configured to conduct current responsive to a forward biasing of the second one of the LED sets.

In some of the embodiments described immediately above, the first one of the current diversion circuits is configured to turn off in response to a voltage at a node. For example a resistor may be coupled in series with the sets and the first one of the current diversion circuits may be configured to turn off in response to a voltage at a terminal of the resistor. In some embodiments, for example, the first one of the current diversion circuits may include a bipolar transistor providing a controllable current path between a node and a terminal of a power supply, and current through the resistor may vary an emitter bias of the bipolar transistor. In some such embodiments, each of the current diversion circuits may include a transistor providing a controllable current path between a node of the sets and a terminal of a power supply and a turn-off circuit coupled to a node and to a control terminal of the transistor and configured to control the current path responsive to a control input. A current through one of the LED sets may provide the control input. The transistor may include a bipolar transistor and the turn-off circuit may be configured to vary a base current of the bipolar transistor responsive to the control input.

With respect to the features described above with various example embodiments of a lamp, the features can be combined in various ways. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

LEDs and/or LED packages used with an embodiment of the invention and can include light emitting diode chips that emit hues of light that, when mixed, are perceived in combination as white light. Phosphors can be used as described to add yet other colors of light by wavelength conversion. For example, blue or violet LEDs can be used in the LED assembly of the lamp and the appropriate phosphor can be in any of the ways mentioned above. LED devices can be used with phosphorized coatings packaged locally with the LEDs or with a phosphor coating the LED die as previously described. For example, blue-shifted yellow (BSY) LED devices, which typically include a local phosphor, can be used with a red phosphor on or in the optically transmissive enclosure or inner envelope to create substantially white light, or combined with red emitting LED devices in the array to create substantially white light. Such embodiments can produce light with a CRI of at least 70, at least 80, at least 90, or at least 95. By use of the term substantially white light, one could be referring to a chromaticity diagram including a blackbody 160 locus of points, where the point for the source falls within four, six or ten MacAdam ellipses of any point in the blackbody 160 locus of points.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Figure 12:
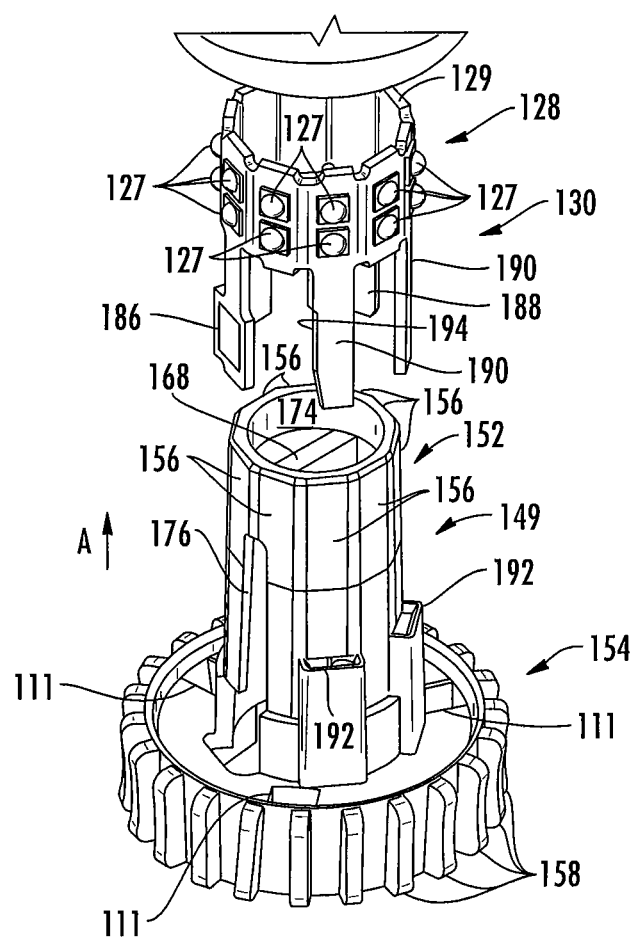
FIG. 12 is an exploded view showing an embodiment of the heat sink and LED assembly of FIG. 1.
Figure 13:
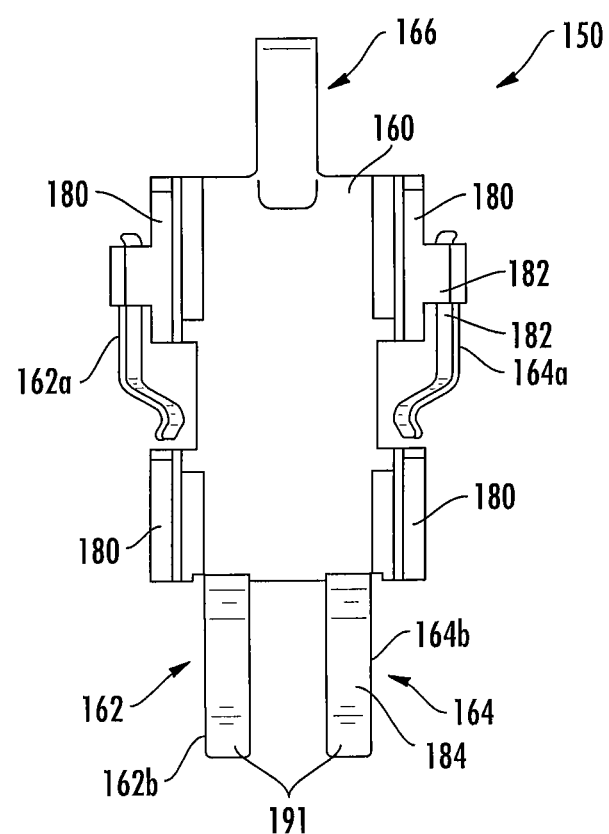
FIG. 13 is a plan view showing an embodiment of the electrical interconnect of FIG. 1.
Figure 14:
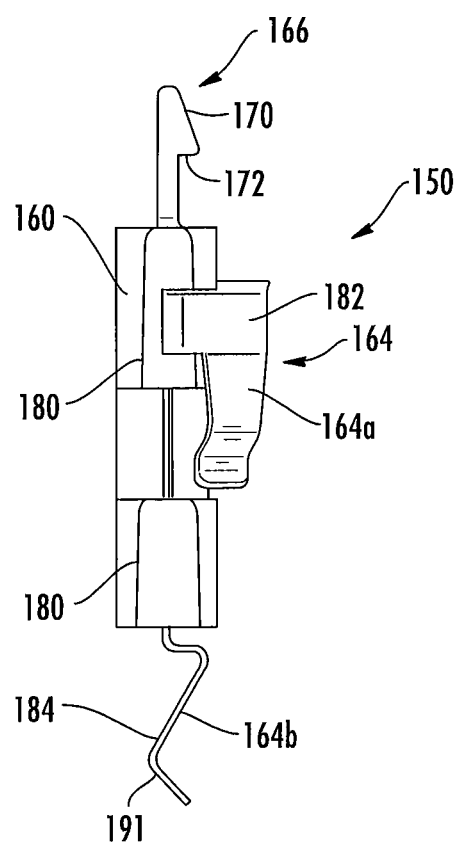
FIG. 14 is a side view showing an embodiment of the electrical interconnect of FIG. 1.
Figure 15:
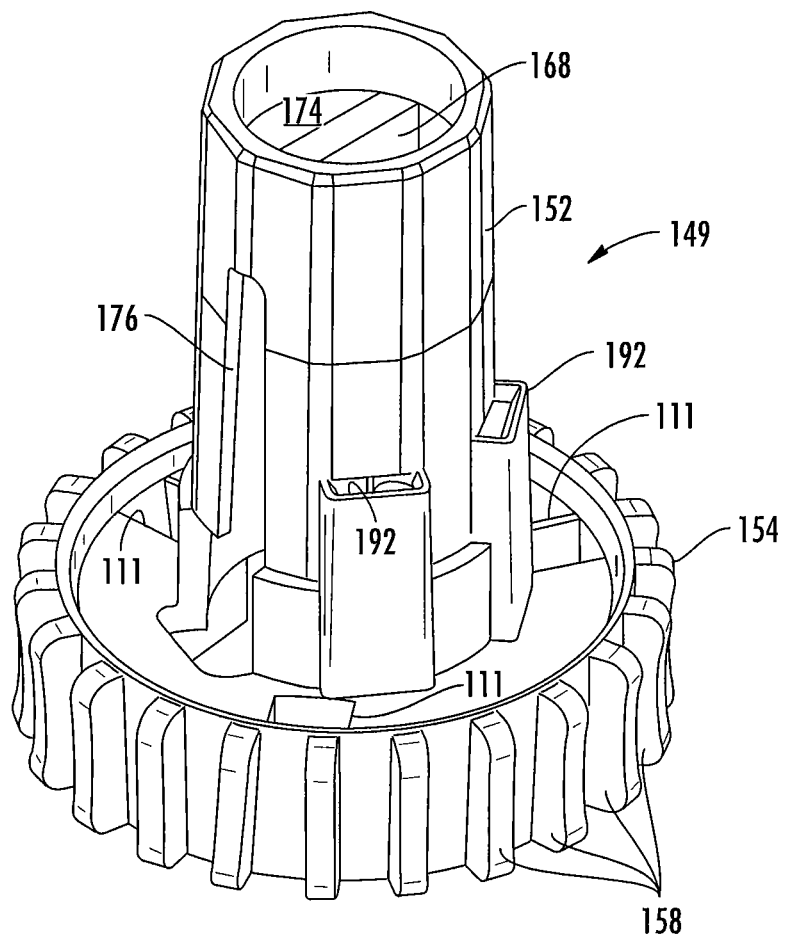
FIG. 15 is a perspective view of the heat sink of FIG. 1.

Referring again to the figures, the LED assembly 130 may be mounted to the heat sink structure 149 by an electrical interconnect 150 where the electrical interconnect 150 provides the electrical connection between the LED assembly 130 and the lamp electronics 110. The heat sink structure 149 comprises a heat conducting portion or tower 152 and a heat dissipating portion 154 as shown for example in FIGS. 12 and 15. In one embodiment the heat sink 149 is made as a one-piece member of a thermally conductive material such as aluminum. The heat sink structure 149 may also be made of multiple components secured together to form the heat structure. Moreover, the heat sink 149 may be made of any thermally conductive material or combinations of thermally conductive materials. In some embodiments the heat conducting portion 152 may be made of non-thermally conducting material such as plastic or portion 152 may be eliminated completely. In these embodiments, the LED assembly 130 may be directly coupled to the heat dissipating portion 154 without the use of a separate heat conducting portion. Extensions 190, as shown for example in FIG. 16, may be formed on the LED assembly that connect the LED assembly 130 to the heat dissipating portion 154 and that position and support the LEDs 127 in the proper position in the enclosure.

The heat conducting portion 152 is formed as a tower that is dimensioned and configured to make good thermal contact with the LED assembly 130 such that heat generated by the LED assembly 130 may be efficiently transferred to the heat sink 149. In one embodiment, the heat conducting portion 152 comprises a tower that extends along the longitudinal axis of the lamp and extends into the center of the enclosure. The heat conducting portion 152 may comprise generally cylindrical outer surface that matches the generally cylindrical internal surface of the LED assembly 130. In the illustrated embodiment the portions of the substrate 129 on which the LEDs 127 are mounted are generally planar. As a result, while the LED assembly 130 is generally cylindrical, the cylinder is comprised of a plurality of planar segments. In one embodiment the heat conducting portion 152 is formed with a plurality of planar facets 156 that abut the planar portions of the submount 129 to provide good surface to surface contact. While the LED assembly 130 and the heat conducting portion 152 are shown as being cylindrical these components may have any configuration provided good thermal conductivity is created between the LED assembly 130 and the heat conducting portion 152. As previously explained, the LED assembly 130 may be formed in a wide variety of shapes such that the heat conducting portion 152 may be formed in a corresponding mating shape. Further, while heat transfer may be most efficiently made by forming the heat conducting portion 152 and the LED assembly 130 with mating complimentary shapes, the shapes of these components may be different provided that sufficient heat is conducted away from the LED assembly 130 that the operation and/or life expectancy of the LEDs are not adversely affected.

The heat dissipating portion 154 is in good thermal contact with the heat conducting portion 152 such that heat conducted away from the LED assembly 130 by the heat conducting portion 152 may be efficiently dissipated from the lamp 100 by the heat dissipating portion 154. In one embodiment the heat conducting portion 152 and heat dissipating portion 154 are formed as one-piece. The heat dissipating portion 154 extends from the interior of the enclosure 112 to the exterior of the lamp 100 such that heat may be dissipated from the lamp to the ambient environment. In one embodiment the heat dissipating portion 154 is formed generally as a disk where the distal edge of the heat dissipating portion 154 extends outside of the lamp and forms an annular ring that sits on top of the open end of the base 102. A plurality of heat dissipating members 158 may be formed on the exposed portion to facilitate the heat transfer to the ambient environment. In one embodiment, the heat dissipating members 158 comprise a plurality of fins that extend outwardly to increase the surface area of the heat dissipating portion 154. The heat dissipating portion 154 and fins 158 may have any suitable shape and configuration.

Different embodiments of the LED assembly and heat sink tower are possible. In various embodiments, the LED assembly may be relatively shorter, longer, wider or thinner than that shown in the illustrated embodiment. Moreover the LED assembly may engage the heat sink and electronics in a variety of manners. For example, the heat sink may only comprise the heat dissipating portion 154 and the heat conducting portion or tower 152 may be integrated with the LED assembly 130 such that the integrated heat sink portion and LED assembly engage the heat dissipating portion 154 at its base. In other embodiments, the LED assembly 130 may engage the heat conducting portion 152 of the heat sink 149 where the LED assembly does not include the connector portion 153. In some embodiments, the LED assembly and heat sink may be integrated into a single piece or be multiple pieces other than as specifically defined.

The electrical interconnect 150 provides the electrical conductors to connect the LED assembly 130 to the lamp electronics 110 and is shown in FIGS. 13, 14, 17 and 18. An inventive aspect of the LED lamp involves the interconnect 150 which provides improved manufacturability by providing an electrical connection between the LED assembly 130 and the drive electronics that does not require bonding of the contacts from the drive electronics to the LED assembly. In other embodiments, an electrical interconnect according to aspects of the present invention can be used to connect the AC line to the drive electronics or from portions of the power supply to other portions of the drive electronics depending on the embodiment and the positioning of the drive electronics on the LED assembly.

In some embodiments, the electrical interconnect includes a support and/or alignment arrangement or element which can be integral with or separate from the contacts. The support and/or alignment arrangement is configured to position the first and/or second set of contacts relative to the corresponding electrical contacts of the LED assembly with power supply, AC line or drive electronics depending on the embodiment. The electrical interconnect enables this connection to be made in an easy fashion to improve manufacturability by reducing the need for soldering of the electrical contacts. The electrical contacts of the interconnect can be configured to engage the corresponding electrical contacts in various ways to maintain a robust electrical connection in easier fashion. Such engagement can take various forms as would be understood by one of ordinary skill in the art with the benefit of this disclosure. As shown in the figures, the electrical interconnect 150 comprises a body 160 that includes a first conductor 162 for connecting to one of the anode or cathode side of the LED assembly 130 and a second conductor 164 for connecting to the other one of the anode or cathode side of the LED assembly 130. The first conductor 162 extends through the body 160 to form an LED-side contact 162a and a lamp electronics-side contact 162b. The second conductor 164 extends through the body 160 to form an LED-side contact 164a and a lamp electronics-side contact 164b. The body 160 may be formed by insert molding the conductors 162, 164 in a plastic insulator body 160. While the electrical interconnect 150 may be made by insert molding the body 160, the electrical interconnect 150 may be constructed in a variety of manners. For example, the body 160 may be made of two sections that are joined together to trap the conductors 162, 164 between the two body sections. Further, each conductor may be made of more than one component provided an electrical pathway is provided in the body 160.

A support and/or alignment mechanism is configured to position the first and/or second set of contacts relative to the corresponding electrical contacts of the LED assembly and power supply. The support and/or alignment mechanism may comprise a first engagement member 166 on body 160 that engages a mating second engagement member 168 on the heat sink 149. In one embodiment the first engagement member 166 comprises a deformable resilient finger that comprises a camming surface 170 and a lock member 172. The second engagement member 168 comprises a fixed member located in the internal cavity 174 of the heat sink 149. The electrical interconnect 150 may be inserted into the cavity 174 from the bottom of the heat sink 149 and moved toward the opposite end of the heat sink such that the camming surface 170 contacts the fixed member 168. The engagement of the camming surface 170 with the fixed member 168 deforms the finger 166 to allow the lock member 172 to move past the fixed member 168. As the lock member 172 passes the fixed member 168 the finger 166 returns toward its undeformed state such that the lock member 172 is disposed behind the fixed member 168. The engagement of the lock member 172 with the fixed member 168 fixes the electrical interconnect 150 in position in the heat sink 149. The snap-fit connection allows the electrical interconnect 150 to be inserted into and fixed in the heat sink 149 in a simple insertion operation without the need for any additional connection mechanisms, tools or assembly steps. While one embodiment of the snap-fit connection is shown, numerous changes may be made. For example, the deformable resilient member may be formed on the heat sink 149 and the fixed member 168 may be formed on the electrical interconnect 150. Moreover, both the first and the second engagement members may be deformable and more than one of each engagement member may be used. Further, rather than using a snap-fit connection, the electrical interconnect 150 may be fixed to the heat sink using other connection mechanisms such as a bayonet connection, screwthreads, friction fit or the like that also do not require additional connection mechanisms, tools or assembly steps.

The support and/or alignment arrangement may properly orient the electrical interconnect 150 in the heat sink 149 and provide a passage for the LED-side contacts 162a, 164a, and may comprise a first slot 176 and a second slot 178 formed in the heat conducting portion 152. The first slot 176 and the second slot 178 may be arranged opposite to one another and receive ears or tabs 180 that extend from the body 160. The tabs 180 are positioned in the slots 176, 178 such that as the electrical interconnect 150 is inserted into the heat sink 149, the tabs 180 engage the slots 176, 178 to guide the electrical interconnect 150 into the heat sink 149. The tabs 180 and slots 176, 178 may be formed with mating trapezoidal shapes such that as the tabs 180 are inserted into the slots 176, 178 the mating narrowing sides properly align the electrical interconnect 150 in the heat sink 149.

The first LED-side contact 162a and the second LED-side contact 164a are arranged such that the contacts extend through the first and second slots 176, 178, respectively, as the electrical interconnect 150 is inserted into the heat sink 149. The contacts 162a, 164a are exposed on the outside of the heat conducting portion 152. The contacts 162a, 164a are arranged such that they create an electrical connection to the anode side and the cathode side of the LED assembly 130 when the LED assembly 130 is mounted on the heat sink 149. In the illustrated embodiment the contacts are identical such that specific reference will be made to contact 164a. The contact 164a comprises a laterally extending portion 182 that extends from the body 160 and that extends through the slot 178. The laterally extending portion 182 connects to a spring portion 182 that is arranged such that it extends over the heat conducting portion 152 and abuts or is in close proximity to the outer surface of the heat conducting portion 152. The contact 164a is resilient such that it can be deformed to ensure a good electrical contact with the LED assembly 130 as will be described.

The first electronic-side contact 162b and the second electronic-side contact 164b are arranged such that the contacts 162b, 164b extend beyond the bottom of the heat sink 149 when the electrical interconnect 150 is inserted into the heat sink 149. The contacts 162b, 164b are arranged such that they create an electrical connection to the anode side and the cathode side of the lamp electronics 110. In the illustrated embodiment the contacts 162b, 164b are identical such that specific reference will be made to contact 164b. The contact 164b comprises a spring portion 184 that is arranged such that it extends generally away from the electrical interconnect 150. The contact 164b is resilient such that it can be deformed to ensure a good electrical contact with the lamp electronics 110 as will be described.

To mount the LED assembly 130 on the heat sink 149 the heat conducting portion 152 of heat sink 149 is inserted into the LED assembly 130 such that the LED assembly 130 surrounds and contacts the heat conducting portion 152. The LED assembly 130 comprises an anode side contact 186 and a cathode side contact 188. The contacts 186, 188 may be formed as part of the conductive submount 129 on which the LEDs are mounted. For example, the contacts 186, 188 may be formed as part of the PCB, lead frame or metal circuit board or other submount 129. The contacts 186, 188 are electrically coupled to the LEDs 127 such that they form part of the electrical path between the lamp electronics 110 and the LED assembly 130. The contacts 186, 188 extend from the LED mounting portion 151 such that when the LED assembly 130 is mounted on the heat sink 149 the contacts 186, 188 are disposed between the LED-side contacts 162a, 164a, respectively, and the heat sink 149. The LED-side contacts 162a, 164a are arranged such that as the contacts 186, 188 are inserted behind the LED-side contacts 162a, 164a, the LED-side contacts 162a, 164a are slightly deformed. Because the LED-side contacts 162a, 164a are resilient, a bias force is created that biases the LED-side contacts 162a, 164a into engagement with the LED assembly 130 contacts 186, 188 to ensure a good electrical coupling between the LED-side contacts 162a, 164a and the LED assembly 130. The engagement between the LED-side contacts of the electrical interconnect 150 and the and the anode side contact and the cathode side contact of the LED assembly 130 is referred to herein as a contact coupling where the electrical coupling is created by the contact under pressure between the contacts as distinguished from a soldered coupling.

To position the LED assembly 130 relative to the heat sink and to fix the LED assembly 130 to the heat sink, a pair of extensions 190 are provided on the LED assembly 130 that engage mating receptacles 192 formed on the heat sink. In one embodiment the extensions 190 comprise portions of the submount 129 that extend away from the LED mounting area 151 of the LED assembly 130. The extensions 190 extend toward the bottom of the heat sink 149 along the direction of insertion of the LED assembly 130 onto the heat sink. The heat sink 149 is formed with mating receptacles 192 that are dimensioned and arranged such that one of the extensions 190 is inserted into each of the receptacles 192 when the heat sink 149 is inserted into the LED assembly 130. The engagement of the extensions 190 and the receptacles 192 properly positions the LED assembly 130 relative to the heat sink during assembly of the lamp.

Moreover, to fix the LED assembly 130 on the heat sink 149 and to seat the LED assembly 130 against the heat conducting portion 152 to ensure good thermal conductivity between these elements, the extensions 190 are formed with camming surfaces 194 that engage the receptacles 192 and clamp the LED assembly 130 on the heat sink 149. As explained previously, in some embodiments the LED assembly 130 is formed of a submount 129 that is formed as a planar member (see FIGS. 19 and 20) and is then bent or formed into the final shape of the LED assembly 130. It will be appreciated that as the submount is formed into the three-dimensional shape, free ends of the submount 129 may be brought into close proximity to one another. For example, referring to FIG. 19, when the planar submount is bent into the three-dimensional cylindrical shape of FIG. 16, the free ends 129a, 129b of the submount 129 are brought closely adjacent to one another. In the mounting system of the invention, the engagement of the extensions 190 with the receptacles 192 is used to hold the LED assembly 130 in the desired shape and to clamp the LED assembly 130 on the heat sink. As shown in FIGS. 16 and 19, a surface of each of the extensions 190 is formed as a camming surface 194 where the camming surface 194 is created by arranging the surface 194 an angle relative to the insertion direction of the LED assembly 130 on the heat sink 149, or as a stepped surface, or as a curved surface or as a combination of such surfaces. As a result, as each extension 190 is inserted into the corresponding receptacle 192 the wall of the receptacle 192 engages the camming surface 194 and, due to the angle or shape of the camming surface 194, exerts a force on the LED assembly 130 tending to move one free end 129a of the LED assembly 130 toward the opposite free end 129b of the LED assembly 130. The extensions 190 are formed at or near the free ends of the LED assembly 130 and the camming surfaces 194 are arranged such that the free ends 129a, 129b of the LED assembly 130 are moved in opposite directions toward one another. As the free ends of the LED assembly 130 are moved toward one another, the inner circumference of the LED assembly 130 is gradually reduced such that the LED assembly 130 exerts an increasing clamping force on the heat conducting portion 152 as the LED assembly 130 is inserted on the heat sink 149. The camming surfaces 194 are arranged such that when the LED assembly 130 is completely seated on the heat sink 149 the LED assembly 130 exerts a tight clamping force on the heat conducting portion 152. The clamping force holds the LED assembly 130 on the heat sink 149 and ensures a tight surface-to-surface engagement between the LED assembly 130 and the heat sink 149 such that heat generated by the LED assembly 130 is efficiently transferred to the heat sink 149. The extensions 190 may be provided with a stop such as shoulder 195 that abuts the edge of the receptacles 192 to limit the insertion of the extensions 190 into the receptacles 192. The LED assembly 130 is held on the heat sink by the wedging action of the extensions 190 in the receptacles 192 as well as the clamping force exerted by the LED assembly 130 on the heat conducting portion 152. While a specific arrangement of the camming surfaces 194 and receptacles 192 is shown, the camming surfaces 194 may be formed on either or both of the heat sink 149 and LED assembly 130. The camming surfaces and the surfaces that are engaged by the camming surfaces may have a variety of structures and forms. Moreover, one free end of the substrate may be held stationary while the opposite end is moved toward the stationary end. While a generally cylindrical heat conducting portion 152 and LED assembly 130 are shown, these components may have a variety of shapes and sizes. The camming surfaces 194 may be arranged such that the LED assembly 130 is moved in a wide variety of planes and directions such that various surfaces of the LED assembly 130 may be brought into engagement with various surfaces of the heat sink 149.

When the electrical interconnect 150 is mounted to the heat sink 149 and the LED assembly 130 is mounted on the heat sink 149, an electrical path is created between the electronics-side contacts 162a, 164a of the electrical interconnect 150 and the LED assembly 130. These components are physically and electrically connected to one another and the electrical path is created without using any additional fasteners, connection devices, tools or additional assembly steps. The electrical interconnect 150 is simply inserted into the heat sink 149 and the heat sink 149 is simply inserted into the LED assembly 130.

Figure 11:
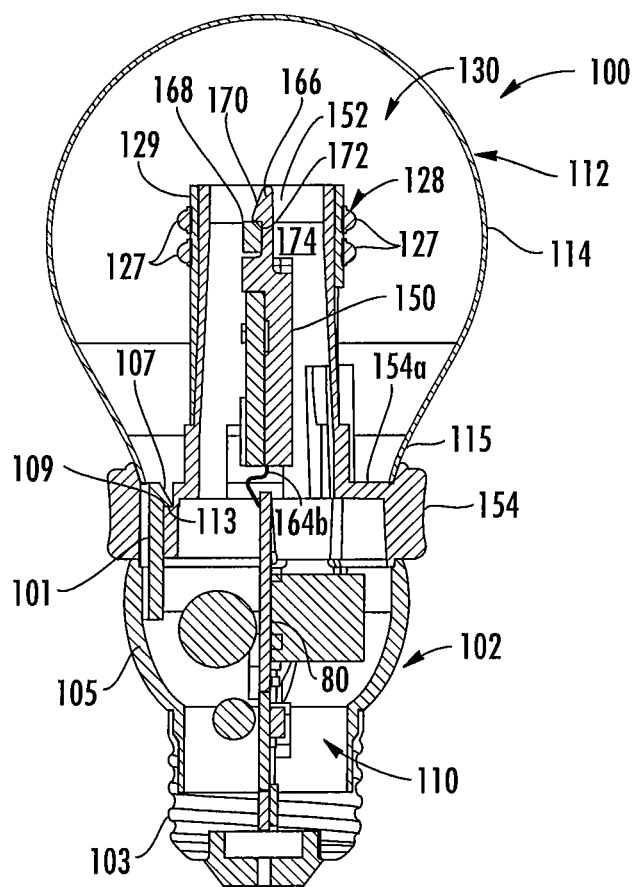
FIG. 11 is a section view similar to FIG. 4.

Once the heat sink/LED assembly subcomponent is completed, the subcomponent may be attached to the base 102 as a unit. First engagement members on the base 102 may engage mating second engagement members on the heat sink structure 149. In one embodiment, the first engagement members comprise deformable resilient fingers 101 that comprise a camming surface 107 and a lock member 109. The second engagement member comprises apertures 111 formed in the heat sink 149 that are dimensioned to receive the fingers 101. In one embodiment, the housing 105 of the base 102 is provided with fingers 101 that extend from the base 102 toward the subcomponent. In the illustrated embodiment three fingers 101 are provided although a greater or fewer number of fingers may be provided. The fingers 101 may be made as one-piece with the housing 105. For example, the housing 105 and fingers 101 may be molded of plastic. The apertures 111 define fixed members 113 that may be engaged by the lock members 109 to lock the fingers 101 to the heat sink 149. The base 102 may be moved toward the bottom of the heat sink 149 such that fingers 101 are inserted into apertures 111 and the camming surfaces 107 of the fingers 101 contact the fixed members 113. The engagement of the fixed members 113 with the camming surfaces 107 deforms the fingers 101 to allow the locking members 109 to move past the fixed members 113. As the lock members 109 pass the fixed members 113 the fingers 101 return toward their undeformed state such that the lock members 109 are disposed behind the fixed members 113. The engagement of the lock members 109 with the fixed members 113 fixes the base 102 to the heat sink 149. The snap-fit connection allows the base 102 to be fixed to the heat sink 149 in a simple insertion operation without the need for any additional connection mechanisms, tools or assembly steps. While one embodiment of the snap-fit connection is shown numerous changes may be made. For example, the deformable members such as fingers may be formed on the heat sink 149 and the fixed members such as apertures may be formed on the base 102. Moreover, both engagement members may be deformable. Further, rather than using a snap-fit connection, the electrical interconnect 150 may be fixed to the heat sink using other connection mechanisms such as a bayonet connection, screwthreads, friction fit or the like. The fixed members 113 may be recessed below the upper surface of the heat dissipation portion 154 such that when the lock members 109 are engaged with the fixed members 113 the fingers 101 do not extend above the plane of the upper surface 154*a* of the heat dissipating portion 154 as best shown in FIG. 11.

As the base 102 is brought into engagement with the heat sink 149, electronic-side contacts 162*b*, 164*b* are inserted into the base 102. The lamp electronics 110 are provided with contact pads 96, 98 that are arranged such that when the base 102 is assembled to the heat sink 149, the electronic-side contacts 162*b*, 164*b* are in electrical contact with the pads 96, 98 to complete the electrical path between the base 102 and the LED assembly 130. The pads 96, 98 are disposed such that the electronic-side contacts 162*b*, 164*b* are deformed slightly such that the resiliency of the contacts exerts a biasing force that presses the contacts into engagement with the pads to ensure a good electrical connection. The electronic-side contacts 162*b*, 164*b* may be formed with angled distal ends 191 that act as camming surfaces to deform the contacts during assembly of the base to the heat sink. The camming surfaces may be arranged to contact a surface in the base, such as the PCB board 80, to deform the contacts upon insertion. The engagement between the electronics-side contacts of the electrical interconnect 150 and the pads on the lamp electronics is referred to herein as a contact coupling where the electrical coupling is created by the contact under pressure between the contacts and the pads as distinguished from a soldered coupling The enclosure 112 may be attached to the heat sink 149. In one embodiment, the LED assembly 130 and the heat conducting portion 152 are inserted into the enclosure 112 through the neck 115. The neck 115 and heat sink dissipation portion 154 are dimensioned and configured such that the rim of the enclosure 112 sits on the upper surface 154*a* of the heat dissipation portion 154 with the heat dissipation portion 154 disposed at least partially outside of the enclosure 112, between the enclosure 112 and the base 102. To secure these components together a bead of adhesive may be applied to the upper surface 154*a* of the heat dissipation portion 154. The rim of the enclosure 112 may be brought into contact with the bead of adhesive to secure the enclosure 112 to the heat sink 149 and complete the lamp assembly. In addition to securing the enclosure 112 to the heat sink 149 the adhesive is deposited over the snap-fit connection formed by fingers 101 and apertures 111. The adhesive flows into the snap fit connection to permanently secure the heat sink to the base.

Figure 17:
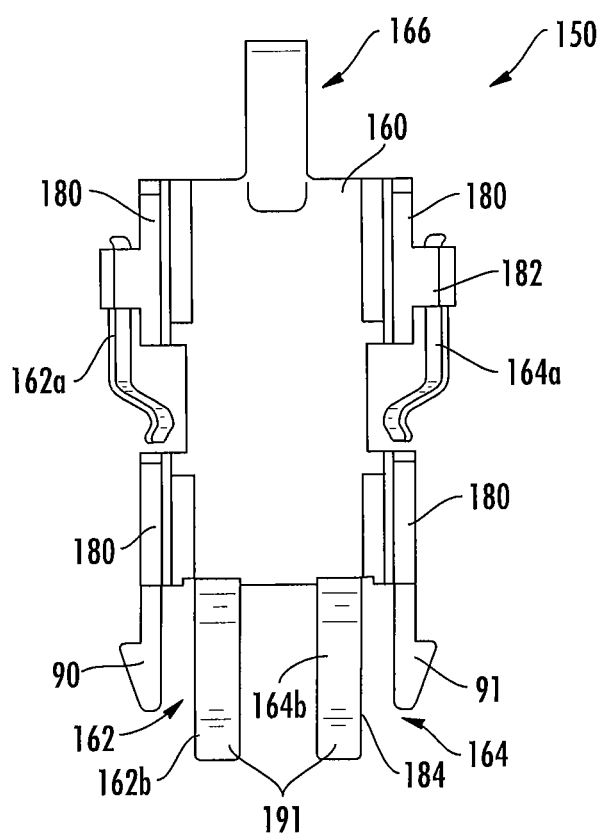
FIG. 17 is a plan view showing another embodiment of the electrical interconnect.

In the illustrated embodiment, the electrical interconnect 150 is used to secure the electrical conductors 162, 164 in the heat sink 149 and to make the electrical connection between the LED assembly 130 and the conductors to thereby complete the electrical path between the LED assembly 130 and the lamp electronics 110. In other embodiments, the electrical interconnect 150 may also be used to effectuate the mechanical connection between the heat sink 149 and the base 102. For example, as shown in FIG. 17, engagement members 90, 91 may extend from the bottom of the body 160 of the electrical interconnect 150 toward the base 102. The engagement members 90, 91 may take the form of the resilient fingers as previously described. Mating engagement members on the base 102, such as receptacles having a fixed member formed on housing 105 (not shown), may be engaged by the engagement members 90, 91 to provide a snap-fit connection between the base 102 and the heat sink/LED assembly subcomponent. In such an arrangement the electrical interconnect 150 functions to complete the electrical path between the LED assembly 130 and the base 102 and to provide the mechanical connection between the base 102 and the heat sink/LED assembly subcomponent.

Figure 18:
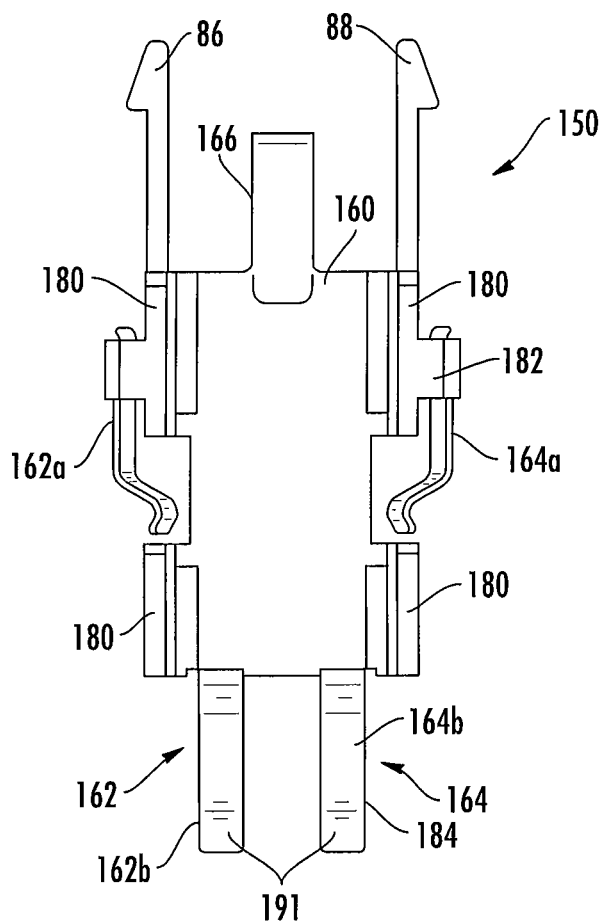
FIG. 18 is a plan view showing still another embodiment of the electrical interconnect.

In other embodiments, the electrical interconnect 150 may also be used to effectuate the mechanical connection between the LED assembly 130 and the heat sink 149. For example, as shown in FIG. 18, the electrical interconnect 150 may be provided with secondary engagement members 86, 88 that engage mating engagement members on the LED assembly 130. The secondary engagement members 86, 88 may take the form of the resilient fingers as previously described. The secondary engagement members 86, 88 may engage the submount 129 directly such as by engaging the top edge of the submount. Alternatively, the LED assembly 130 may be provided with mating engagement members. For example, fixed members having engagement surfaces may be molded or otherwise formed on the submount 129 such as during the molding of the supports as previously described. In such an embodiment the electrical interconnect 150 functions to form the mechanical connection between the LED assembly 130 and the heat sink 149.

It is to be understood that the electrical interconnect 150 may be used to provide one or all of the functions described herein. Moreover, the electrical interconnect 150 may be used to provide various combinations of the functions described herein.

In some embodiments the form factor of the lamp is configured to fit within the existing standard for a lamp such as the A19 ANSI standard. Moreover, in some embodiments the size, shape and form of the LED lamp may be similar to the size, shape and form of traditional incandescent bulbs. Users have become accustomed to incandescent bulbs having particular shapes and sizes such that lamps that do not conform to traditional forms may not be as commercially acceptable. The LED lamp of the invention is designed to provide desired performance characteristics while having the size, shape and form of a traditional incandescent bulb.

In the lamp of the invention, the LEDs 127 are arranged at or near the optical center of the enclosure 112 in order to efficiently transmit the lumen output of the LED assembly through the enclosure 112. The most efficient transmission of light through a transparent or semitransparent surface is when the light incident to the surface is normal to the surface. For example, if the enclosure is a perfect sphere, an omnidirectional light source located at the center of the sphere provides the most efficient transmission of light through the enclosure because the light is normal to the surface of the enclosure at all points on the sphere's surface. In the lamp of the invention the LEDs 127 are arranged at or near the optical center of the enclosure 112 to maximize the amount of light that is normal to the surface of enclosure 112. While all of the light emitted from LEDs 127 is not normal to the enclosure 112, with the LED assembly positioned at or near the optical center of the enclosure more of the light is normal to the enclosure than in solid state lamps where the light source is located near the base of the enclosure or is otherwise located such that a large portion of the light is incident on the enclosure at other than right angles. By facing the LEDs 127 outwardly, the LEDs emit light in a generally hemispherical pattern that maximizes the amount of light that is normal to the enclosure 112. Thus, the arrangement of the outwardly facing LEDs at or near the optical center of the enclosure, as shown in the figures, provides efficient transmission of the light through the enclosure 112 to increase the overall efficiency of the lamp.

A second mechanism used in the lamp of the invention to increase the overall efficiency of the lamp is the use of a boost converter topology power supply to minimize losses and maximize conversion efficiency. Examples of boost topologies are described in U.S. patent application Ser. No. 13/462,388, entitled "Driver Circuits for Dimmable Solid State Lighting Apparatus", filed on May 2, 2012 which is incorporated by reference herein in its entirety; and U.S. patent application Ser. No. 13/662,618, entitled "Driving Circuits for Solid-State Lighting Apparatus with High Voltage LED Components and Related Methods", filed on Oct. 29, 2012 which is incorporated by reference herein in its entirety. With boost technology there is a relatively small power loss when converting from AC to DC. For example, boost technology may be approximately 92% efficient while other power converting technology, such as Bud technology, may be approximately 85% efficient. Using a less efficient conversion technology decreases the efficiency of the system such that significant losses occur in the form of heat. The increase in heat must be dissipated from the lamp because heat adversely affects the performance characteristics of the LEDs. The increase in efficiency using boost technology maximizes power to the LEDs while minimizing heat generated as loss. As a result, use of boost topology, or other highly efficient topology, provides an increase in the overall efficiency of the lamp and a decrease in the heat generated by the power supply.

In one embodiment of the invention as shown and described herein, 20 LEDs are provided where each LED comprises four LED chips. Each chip may be a 3 volt LED chip such that each LED is a 12 volt part. Using 20 LEDs provides an LED assembly of approximately 240 volts. Such an arrangement provides a lamp having an output comparable to a 60 Watt incandescent bulb. The use of 20 LEDs each comprising 4 LED chips provides a LED light source having a relatively large epitaxial (EPI) or light producing area where each LED may be operated at relatively low current. In one embodiment described herein each LED chip may comprise a DA600 chip sold by CREE Inc., where each chip is a square 600 micron chip having an EPI area of approximately 0.36 mm$^2$ such that each LED having 4 LED chips has approximately 1.44 mm$^2$ of EPI area. A system such as described herein with 20 LEDs has approximately 28.8 mm$^2$ of EPI area.

Generally speaking, in a typical LED the greater the operating current of the LEDs the higher the lumen output of the LED. As a result, in a typical LED lamp the LEDs are operated in the area of about 350 mA/(mm$^2$ of EPI area) in order to maximize the lumen output per square mm of EPI area. While operating the LEDs at high current increases the lumen output it also decreases the efficiency (lumens per watt) of the LEDs such that significant losses occur in the form of heat. For example, the efficiency of one typical LED is greatest in the 60-90 mA/(mm$^2$ of EPI area) and gradually decreases as the mA/(mm$^2$ of EPI area) increases. The increase in heat due to the lowering of efficiency must then be dissipated from the lamp because heat adversely affects the performance characteristics of the LEDs. The present invention uses the generally inverse relationship between efficiency and lumen output to provide lumen output at a desired level in a more efficient (i.e. less heat loss per lumen) lamp. While the relationship between efficiency and lumen output is described as generally inverse it is noted that efficiency also decreases at low current per unit area of EPI such that decreasing current below the high efficiency range provides an LED that is both less efficient and produces fewer lumens per unit area of EPI. Thus, it is desired to operate the LEDs in the area of greatest efficiency while providing a desired lumen output using a relatively large EPI area. The large EPI area may be provided using a plurality of LEDs that together provide the desired large EPI area.

Using a large EPI area LED assembly operating at a relatively low current decreases the lumen output per unit of EPI area but increases the efficiency of the LEDs such that less heat is generated per lumen output. The lower lumen output per unit of EPI area is offset by using a larger EPI area such that the lumen output of the lamp is increased per unit of heat generated by the system. In one embodiment, an LED assembly having approximately 28.8 mm$^2$ of EPI area is used where the LEDs are operated at approximately 107 mA/(mm$^2$ of EPI area) to provide the equivalent lumens as a 60 Watt incandescent light bulb. To provide the equivalent lumens as a 60 Watt incandescent light bulb an LED assembly having an EPI area of between 15 and 40 mm$^2$ may be used where the LEDs are operated in the range of 200 and 75 mA/(mm$^2$ of EPI area). The larger the EPI area the smaller the operating current such that an LED assembly having 40 mm$^2$ of EPI area is operated at 75 mA/(mm$^2$ of EPI area) and a LED assembly having 15 mm$^2$ of EPI area is operated at 200 mA/(mm$^2$ of EPI area). Other operating parameters for an LED assembly for a 60 watt equivalent lamp are 10 mm$^2$ of EPI area operated at 300 mA/(mm$^2$ of EPI area) and a LED assembly having 20 mm$^2$ of EPI area operated at 150 mA/(mm$^2$ of EPI area). For lamps having lumen output equivalent to other than a 60 watt bulb, such as a 40 watt bulb or a 100 watt bulb these values may be scaled accordingly. While the scaling is not strictly linear the scaling up or down in equivalent wattage is approximately linear. The term large EPI area as used herein means a light producing area of sufficient size to produce the desired lumen output when the LEDs are operated at a current at or near the highest efficiency area on the amperage to lumen per Watt curve for the LED. The desired lumen output can be achieved by increasing and/or decreasing current to the LEDs while simultaneously decreasing and/or increasing the EPI area. The relationship between these variables depends on the amount of heat that may be adequately dissipated from the lamp using a relatively small heat sink and the amount of EPI area (e.g. the number of LEDs) that may be supported in the lamp. The size of the heat sink is selected such that the heat sink does not affect the outward design of the lamp such that the lamp has the same general size, shape and appearance as a traditional incandescent bulb. The size of the EPI area and the mA per unit of EPI area may then be selected to generate heat that is less than the amount of heat that can be adequately dissipated by the heat sink.

As a result, the lamp of the invention generates the desired lumen output while generating significantly less heat than in existing lamps by using the LEDs located at the optical center of the enclosure, boost conversion technology and efficient EPI area to mA/(mm$^2$ of EPI area) as described above. Because of the efficiencies engineered into the lamp, the heat generated by the system is lower compared to existing LED lamps of similar lumen output such that a relatively small heat sink may be used. Because the heat sink may be made smaller than in known LED lamps the form factor of the lamp may follow the form factor of traditional incandescent bulbs. In one embodiment, the lamp 100 is configured to be a replacement for an ANSI standard A19 bulb such that the dimensions of the lamp 100 fall within the ANSI standards for an A19 bulb. The dimensions may be different for other ANSI standards including, but not limited to, A21 and A23 standards. In some embodiments, the LED lamp 100 may be equivalent to standard watt incandescent light bulbs such as, but not limited to, 40 Watt or 60 Watt bulbs. The use of a smaller heat sink allows greater freedom in the design of the physical shape, size and configuration of the lamp such that the lamp may be configured to have a variety of shapes and sizes. Referring to FIG. 1 for example, the heat sink intrudes to a minimal degree on the external form of the lamp such that the lamp may be designed and configured to closely match the size and shape of a standard incandescent bulb such as an A19 bulb. Moreover, because a relatively small heat sink may be used it may be possible to provide sufficient heat dissipation using a thermally conductive base 102 without the intervening heat sink structure 154. In some embodiments of an equivalent 60 watt and 75 watt lamp (total bulb power between 9 and 11 watts), a heat sink having an exposed surface area in the range of range of approximately 20-40 square centimeters is sufficient and may be considered small. In one embodiment for a 60 watt lamp the heat sink may have an exposed surface area of about 30 square centimeters. For 100W applications (or 75W applications where higher optical losses are incurred such as in directional lamps with a total bulb power greater than 11 watts but less than 17 watts) the exposed surface area of the heat sink is in the range of range of approximately 40-80 square centimeters. In one embodiment for a 100 watt lamp the heat sink may have an exposed surface area of about 60 square centimeters.

LEDs are thermally responsive light producers where, as the LED gets hotter, the lumens produced by the LED decreases. Because the lamp of the invention uses a relatively large EPI area to more efficiently generate large lumen outputs, the size of the heat sink may be reduced such that the loss of lumen output due to the heating of the LEDs may be designed into the system. In such an arrangement, the LEDs are not cooled to the extent required in existing devices and the heat sink may be correspondingly reduced in size. For example, in one of the most efficient types of commercially available lamps, a troffer lamp, the large heat sink allows the LEDs to operate at about a 4% loss of lumens due to heat. In a typical bulb configuration the loss of lumens due to heat is engineered to be as small as possible and may be on the order of less than 10%. In order to provide such a low "roll off" or loss of lumens due to heat build-up the typical LED lamp requires a relatively large heat sink structure. The lamp of the invention is designed such that the roll off or loss of lumens due to heat build-up may be between approximately 15% and 20%. Such a loss would normally be considered excessive; however, because of the use of a large EPI area and the other efficiencies built into the system as discussed above, the LED lamp of the invention can afford a larger lumen roll off at the LEDs and still provide a lamp that provides the desired lumen output at the system level. In the system of the invention the LEDs are operated at a junction temperature (the temperature at the junction between the LED chip and the package) of between approximately 110° and 120°. Because the LEDs are allowed to operate at a relatively high junction temperature the heat sink may be made smaller and less intrusive when compared to existing LED lamps. As explained above, the ability to use a smaller heat sink structure allows the heat sink to be a smaller and less obtrusive component of the overall lamp allowing the lamp to be configured to be of similar size and shape to a standard incandescent bulb as shown in the figures.

FIGS. 21-26 show an embodiment of a lamp that uses the LED assembly 130, heat sink with the tower arrangement 149, and electrical interconnect 150 as previously described in a BR and PAR type lamp. The previous embodiments of a lamp refer more specifically to an omnidirectional lamp such as an A19 replacement bulb. In the BR or PAR lamp shown in FIG. 21 the light is emitted in a directional pattern rather than in an omnidirectional pattern. Standard BR type bulbs are reflector bulbs that reflect light in a directional pattern; however, the beam angle is not tightly controlled and may be up to about 90-100 degrees or other fairly wide angles. The bulb shown in FIGS. 21-26 may be used as a solid state replacement for such BR, PAR or reflector type bulbs or other similar bulbs.

The lamp comprises a base 102, heat sink 149, LED assembly 130 and electrical interconnect 150 as previously described. As previously explained, the LED assembly 130 generates an omnidirectional light pattern. To create a directional light pattern, a primary reflector 300 is provided that reflects light generated by the LED assembly 130 generally in a direction along the axis of the lamp. Because the lamp is intended to be used as a replacement for a BR type lamp the reflector 300 may reflect the light in a generally wide beam angle and may have a beam angle of up to approximately 90-100 degrees. As a result, the reflector 300 may comprise a variety of shapes and sizes provided that light reflecting off of the reflector 300 is reflected generally along the axis of the lamp. The reflector 300 may, for example, be conical, parabolic, hemispherical, faceted or the like. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it. The reflector 300 may be made of a specular material. The specular reflectors may be injection molded plastic or die cast metal (aluminum, zinc, magnesium) with a specular coating. Such coatings could be applied via vacuum metallization or sputtering, and could be aluminum or silver. The specular material could also be a formed film, such as 3M's Vikuiti ESR (Enhanced Specular Reflector) film. It could also be formed aluminum, or a flower petal arrangement in aluminum using Alanod's Miro or Miro Silver sheet.

The reflector 300 is mounted in the lamp such that it surrounds the LED assembly 130 and reflects some of the light generated by the LED assembly. In some embodiments, the reflector 300 reflects at least 20% of the light generated by the LED assembly. In other embodiments, the reflector 300 reflects about at least 40% of the light generated by the LED assembly 130 and in other embodiments, the reflector 300 may reflect about at least 60% of the light generated by the LED assembly 130. Because the reflector 300 may be at least 95% reflective, the more light that hits the reflector 300 the more efficient the lamp. This is in contrast to the reflective aluminum coating typically found on a standard BR lamp enclosure that is approximately 80% reflective.

The reflector 300 may be mounted on the heat sink 149 or LED assembly 130 using a variety of connection mechanisms. In one embodiment, the reflector 300 is mounted on the heat conducting portion or tower 152 of the heat sink 149. As shown, the reflector 300 is formed as a slip collar with a flare 300a at the end such that when the LED assembly 130 is inserted, the light directed primarily toward the base encounters the reflector 300 and is reflected out the exit surface 308.

The LED assembly 130 is mounted as previously described to trap the reflector 300 between the heat sink 149 and the LED assembly 130. The reflector may also be mounted on the dissipating portion 153 of the heat sink. The reflector 300 may also be mounted to the heat sink 149 or LED assembly 130 using separate fasteners, adhesive, friction fit, mechanical engagement such as a snap-fit connection, welding or the like.

In one embodiment, the reflector 300 is made in two portions 350 and 352 that together surround the heat conducting portion or tower 152 and connect to one another using snap fit connectors 354 to clamp the heat sink therebetween as shown in FIGS. 76-84. In the illustrated embodiment the two portions are identical such that a single component may be used although the two portions may be different. The snap fit connectors 354 may comprise a deformable tang 356 on one reflector portion that is received in a mating receptacle 358 on the other reflector portion where each reflector portion comprises one tang and one receptacle. However, two tangs may be formed on one portion and two receptacles may be formed on the other portion. The tangs 356 may be inserted into the receptacles 358 such that locking surfaces 360 on the tangs 356 are disposed behind the receptacles 358. The tangs and/or receptacles may be made of resilient material to allow these components to deflect as the tangs 356 are inserted into the receptacles 358. The two portions 350 and 353 may be brought into engagement with one another with the heat sink 152 trapped between the portions. The reflector 300 may comprise legs 366 that are supported on protrusions 368 formed on the heat sink 152 to properly vertically position the reflector 300 on the heat sink 152 and to maintain the reflector in the proper orientation relative to the LEDs. The reflector 300 may also include protrusions 370 that extend toward the interior of the reflector and that engage the lateral sides of the protrusions 368 or other heat sink structure to fix the angular relationship between the reflector and heat sink such that the reflector is prevented from rotating relative to the heat sink. The structure of the reflector described above may be used with any of the embodiments of the reflector and in any of the lamps described herein.

The reflector 300 is dimensioned such that the LED assembly 130, heat sink 149 and reflector 300 may be inserted through the opening 304 in the neck of a BR type enclosure 302. The LED assembly 130, heat sink 149 and reflector 300 are inserted into the BR enclosure 302. The BR enclosure 302 may be secured to the heat sink 149 as previously described using adhesive or other connection mechanism. The enclosure 302 comprises a body 306 that is typically coated on an interior surface with a highly reflective material such as aluminum to create a reflective surface 310 and an exit surface 308 through which the light exits the lamp. The exit surface 308 may be frosted or otherwise treated with a light diffuser material. Moreover, the reflector 300 may be mounted to the enclosure 302 rather than to the LED assembly and/or heat sink.

As previously explained, the reflector 300 may be positioned such that it reflects some of the light generated by the LED assembly 130. However, at least a portion of the light generated by the LED assembly 130 may not be reflected by the reflector 300. At least some of this light may be reflected by the reflective surface 310 of the enclosure 302. Some of the light generated by the LED assembly 130 may also be projected directly out of the exit surface 308 without being reflected by the primary reflector 300 or the reflective surface 310.

FIGS. 27-37 show an embodiment of a PAR type lamp that uses the LED assembly 130, heat sink with the tower arrangement 149 and electrical interconnect 150 as previously described. In a PAR type lamp the light is emitted in a directional pattern. Standard PAR bulbs are reflector bulbs that reflect light in a direction where the beam angle is tightly controlled using a parabolic reflector. PAR lamps may direct the light in a pattern having a tightly controlled beam angle such as, but not limited to, 10°, 25° and 40°. The bulb shown in FIG. 22 may be used as a solid state replacement for such a reflector type PAR bulb.

The lamp comprises a base 102, heat sink 149, electrical interconnect 150 and LED assembly 130 as previously described. As previously explained, the LED assembly 130 generates an omnidirectional light pattern. To create a directional light pattern, a primary reflector 400 is provided that reflects light generated by the LED assembly 130 generally in a direction along the axis of the lamp. Because the lamp is intended to be used as a replacement for a PAR type lamp, the reflector 400 may reflect the light in a tightly controlled beam angle. The reflector 400 may comprise a parabolic surface 400a such that light reflecting off of the reflector 400 is reflected generally along the axis of the lamp to create a beam with a controlled beam angle.

The reflector 300 is preferably made of a specular material. The specular reflectors may be injection molded plastic or die cast metal (aluminum, zinc, magnesium) with a specular coating. The specular material could also be a formed film, such as 3M's Vikuiti ESR (Enhanced Specular Reflector) film. It could also be formed aluminum, or a flower petal arrangement in aluminum using Alanod's Miro or Miro Silver sheet. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it.

The reflector 400 is mounted in the lamp such that it surrounds the LED assembly 130 and reflects some of the light generated by the LED assembly. In some embodiments, the reflector 400 reflects over 20% of the light generated by the LED assembly 130. In other embodiments, the reflector 400 reflects about at least 40% of the light generated by the LED assembly 130 and in other embodiments, the reflector 400 may reflect about at least 60% of the light generated by the LED assembly 130. Because the reflector 400 may be at least 90% reflective the more light that hits the reflector 400 the more efficient the lamp. This is in contrast to the reflective aluminum coating typically found on a standard PAR lamp enclosure that is approximately 80% reflective. Because the lamp is used as a PAR replacement, the beam angle is tightly controlled where the light that is reflected from the reflector 400 is emitted from the lamp at a tightly controlled the beam angle.

The reflector 400 is mounted such that the light emitted from the LED assembly 130 is emitted at or near the focus of the parabolic reflector 400. In some embodiments, the two tiered arrangement of LEDs, as described for example with respect to FIGS. 1-5, may be disposed such that the light is emitted at or near enough to the focus of the reflector 400 that the beam angle of the light that is emitted from the lamp is at the desired beam angle. In some embodiments, one tier of LEDs may be disposed on the focus of the reflector and the other tier of LEDs may be positioned slightly off of the focus of the parabolic reflector. In some embodiments, a single tier of LEDs may be used that are disposed on the focus of the reflector. Further, the two tiers of LEDs may be used where the vertical pairs of LEDs are disposed under a single lens such that light emitted from the pairs of LEDs originates at the focus of the reflector 400. Other arrangements of the LEDs may be made provided that the reflector reflects the light at the desired beam angle. While a one tier and a two tier LED assembly have been described, three or more tiers may be used in the LED assembly.

The reflector 400 may be mounted on the heat sink 149 or LED assembly 130 using a variety of connection mechanisms. In one embodiment, the reflector 400 comprises a sleeve that is mounted on the heat conducting portion or tower 152 of the heat sink 149 as previously described. The LED assembly 130 is mounted as previously described to trap the reflector 400 between the heat sink 149 and the LED assembly 130. The reflector 400 may also be mounted to the heat sink 149 or LED assembly 130 using separate fasteners, adhesive, friction fit, mechanical engagement such as a snap-fit connector, welding or the like. Moreover, the reflector 400 may be mounted to the enclosure 402 rather than to the LED assembly and/or heat sink.

The reflector 400 is dimensioned such that the LED assembly 130, heat sink 149 and reflector 400 may be inserted through the opening 404 in the neck of a PAR type enclosure 402. To assemble the lamp, the LED assembly 130, heat sink 149 and reflector 400 are inserted into the PAR enclosure 402. The enclosure 402 is secured to the heat sink 149 as previously described using adhesive or other connection mechanism. The enclosure 402 comprises a body 404 that comprises a parabolic reflective surface 406 that is typically coated with a highly reflective material such as aluminum and an exit surface 408 through which the light exits the lamp. The exit surface 408 may be frosted or otherwise treated with a light diffuser material.

As previously explained, the reflector 400 may be positioned such that it reflects some of the light generated by the LED assembly 130. However, at least a portion of the light generated by the LED assembly 130 may not be reflected by the reflector 400. At least some of this light may be reflected by the parabolic reflective surface 406 of the enclosure 402. Some of the light generated by the LED assembly 130 may be projected out of the exit surface 408 without being reflected by the reflector 400 or the reflective surface 406.

One potential issue with using a single, large parabolic reflector 400 that surrounds the entire LED assembly 130, as described above, is that some of the light may be reflected in a generally horizontal plane such that it circles the reflector 400 and reflects multiple times from the reflector 400 before being emitted from the lamp. Such a situation results in a loss of efficiency. To lower these losses, a parabolic reflector 500 may be provided for each LED 127 such that each LED 127 has associated with it a relatively small parabolic reflector 500 that reflects light from that LED as shown in FIGS. 38-49. In some embodiments, the reflector 500 and associated LED 127 may form a unit that is mounted on the LED assembly 130. In some embodiments, the two (or additional) tiered arrangement of LEDs may be used where the LEDs 127 and reflectors 500 are horizontally offset from one another such that the light emitted from each LED 127 is not blocked by the vertically adjacent LED and reflector. In some embodiments, a single tier of LEDs 127 and associated reflectors 500 may be used. In the illustrated embodiment a two tiered arrangement of LEDs is shown where each vertical pair of LEDs is associated with a single reflector. The reflectors 500 are formed as part of a unitary assembly or sleeve 501 such that all of the reflectors may be mounted on the LED assembly as a unit. Other arrangements of the LEDs 127 and reflectors 500 may be used provided that the reflectors may reflect the light at the desired beam angle. The reflectors 500 and LEDs 127 may be in a one-to-one relationship or a single reflector may be used with more than one LED, but with fewer than all of the LEDs of LED array 130. The reflectors 500 may be specular. Moreover, the LED assembly may be modified to allow the mounting of the reflectors with the associated LEDs. For example, the LEDs may need to be more widely spaced to accommodate the reflectors (compare FIG. 35 to FIG. 47) or the LED assembly may need to be made smaller.

FIGS. 50-64 shows an embodiment of a lamp that uses the base 102, LED assembly 130, heat sink with the tower 149, and electrical interconnect 150 as previously described in a PAR type lamp. The bulb shown in FIGS. 50-64 may be used as a solid state replacement for such reflector type bulbs. As previously explained, the LED assembly 130 generates an omnidirectional light pattern. To create a directional light pattern, a primary reflector 600 is provided that reflects light generated by the LED assembly 130 through a secondary focal point 601. The reflector 600 may comprise an elliptical specular reflecting surface 600a that reflects the light through the secondary focal point 601. In some embodiments, the reflector may be a diffuse or Lambertian reflector and may be made of a white highly reflective material such as injection molded plastic, white optics, PET, MCPET, or other reflective materials. The reflector may reflect light but also allow some light to pass through it. The reflector 600 may be a diffuse reflector; however, in some embodiments the reflector surface must be specular. The specular reflector may be injection molded plastic or die cast metal (aluminum, zinc, magnesium) with a specular coating. Such coatings could be applied via vacuum metallization or sputtering, and could be aluminum or silver. The specular material could also be a formed film, such as 3M's Vikuiti ESR (Enhanced Specular Reflector) film. It could also be formed aluminum, or a flower petal arrangement in aluminum using Alanod's Miro or Miro Silver sheet. The light reflected by an elliptical reflector 600 is reflected through the secondary focal point 601 and generally toward the exit surface of the lamp but is reflected at a widely divergent beam angle. The secondary focal point 601 of the reflected light is used as a virtual light source as will be described.

The reflector 600 is mounted in the lamp such that it surrounds the LED assembly 130 and reflects most of the light generated by the LED assembly. In some embodiments, the reflector 600 reflects about at least 20% of the light generated by the LED assembly 130. In other embodiments, the reflector 600 reflects about at least 40% of the light generated by the LED assembly 130 and in other embodiments, the reflector 600 may reflect about at least 60% of the light generated by the LED assembly 130. Because the reflector 600 may be at least 90% reflective the more light that hits the reflector the more efficient the lamp. This is in contrast to the reflective aluminum coating typically found on a standard PAR lamp enclosure that is approximately 80% reflective.

The reflector 600 may be mounted on the heat sink 149 or LED assembly 130 using a variety of connection mechanisms. In one embodiment, the reflector 600 is formed as a slip sleeve and is mounted on the heat conducting portion 152 of the heat sink 149 and the LED assembly 130 is mounted as previously described to trap the reflector 600 between the heat sink 149 and the LED assembly 130. The reflector 600 may also be mounted to the heat sink 149 or LED assembly 130 using separate fasteners, adhesive, friction fit, mechanical engagement such as a snap-fit, welding or the like. Moreover, the reflector 600 may be mounted to the enclosure 602 rather than to the LED assembly and/or heat sink.

The reflector 600 is dimensioned such that the LED assembly 130, heat sink 149 and reflector 600 may be inserted through the opening 604 in the neck of a PAR style enclosure

602. To assemble the lamp, the LED assembly, heat sink and reflector 600 are inserted into the PAR enclosure 602. The enclosure 602 is secured to the heat sink 149 as previously described using adhesive or other connection mechanism.

Referring to FIGS. 61-64, the enclosure 602 comprises a body 606 that is typically coated with a highly reflective material such as aluminum and an exit surface in the form of a lens 702 through which the light exits the lamp. The lens 702 focuses the light from the virtual source 601 (reflector focal point) to create a beam of light at the desired beam angle. The entry surface of lens 702 includes a plurality of substantially triangular concentric rings 704, each having non-vertical sides. By the term "non-vertical," what is meant is that neither side of the triangle formed by the cross-section of the concentric ring is parallel to the direction in which the light is emanated from virtual source 601.

Figure 61:
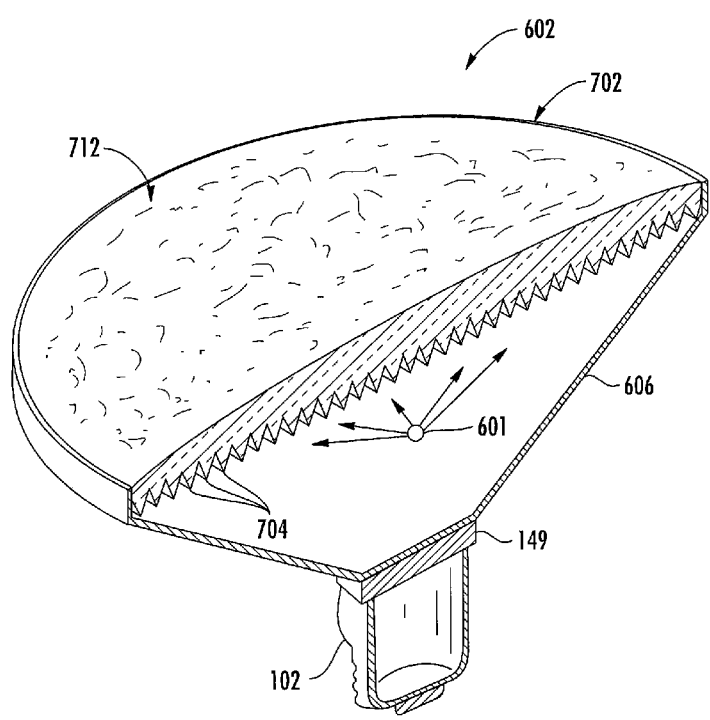
FIG. 61 is a cross-sectional view of a lens according to example embodiments of the present invention.

Exit surface 712 of lens 702 includes surface texturing. This surface texturing provides additional diffusion for light exiting the light engine. This surface texture is represented in FIG. 61 schematically; however, could consist of dimpling, frosting, or any other type of texture that can be applied to a lens for a lighting system. Finally, it should be observed that exit surface 712 is slightly curved. However, embodiments of the invention can include a flat exit surface, or a curved entry service. Both surfaces of the lens could be flat or curved. Several examples will be presented herein.

A lens 702 according to example embodiments can be made in various ways. The example of FIGS. 61-64 is a schematic illustration. The actual numbers of concentric rings, and the actual size and spacing of the rings, are not to scale. The cross-section of the concentric features in FIG. 61 is an equilateral triangle, but other triangular shapes can be used. Additionally, the vertex angle of the equilateral triangles in FIG. 1 is constant, as is the spacing of the concentric circular features. Varying these properties of the lens features can allow the formation of differing beam patterns. Either the vertex angle of the triangles or the spacing interval of the concentric features across the diameter of the lens can change or have a gradient applied. For example, in some embodiments, the substantially triangular concentric rings can be spaced at a fixed interval from about 0.1 mm to about 5 mm across the radius of the lens. In some embodiments, they can be spaced at a fixed interval from between about 0.2 mm to about 3 mm. In some embodiments they can be spaced a fixed interval from between about 0.3 mm to about 2 mm. In some embodiments they can be spaced at a fixed interval of about 0.5 mm. A gradient can also be applied to the spacing so that the interval varies. For example, the interval can be smaller near the center of the lens and progress to a larger interval closer to the edge of the lens, or vice versa. Multiple discrete intervals can also be used.

Figure 62:
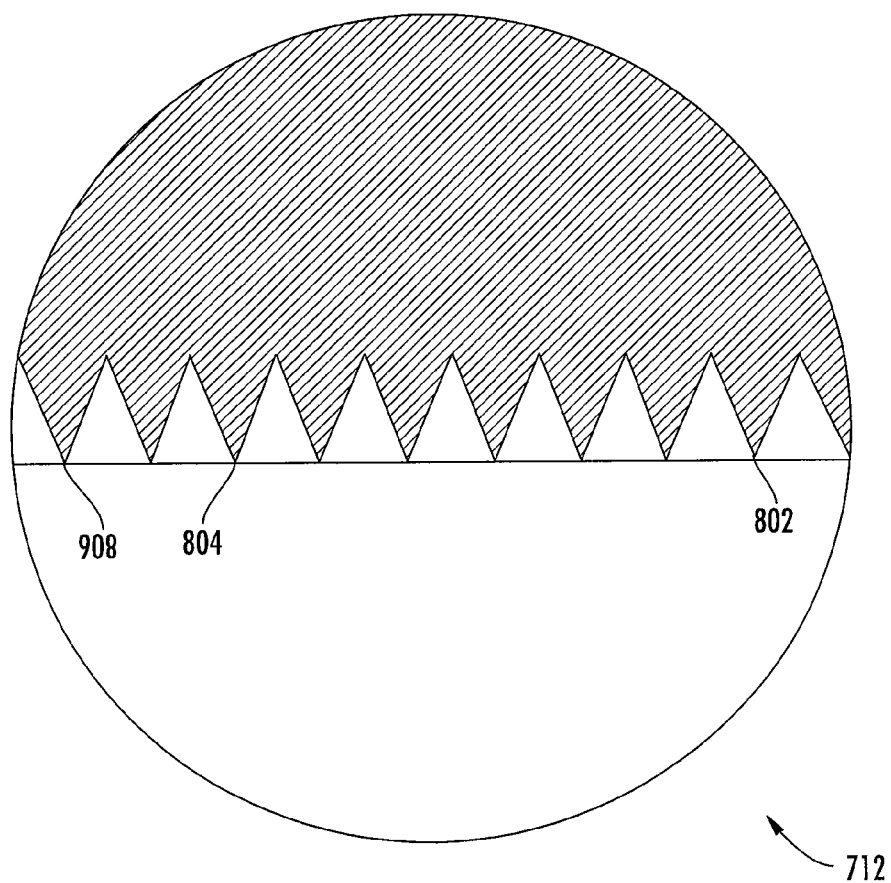
FIG. 62 is a magnified, cross-sectional view of the lens depicted in FIG. 61.

FIG. 62 shows a close-up, cross-sectional view of a portion of entry surface of lens 712. Substantially triangular concentric rings are visible, spaced at an interval of 0.500 mm. As can be observed in the figure, the height of the features is 0.635 mm. As can also be observed, a gradient is applied to the vertex angle of the features. Vertex 802 has an angle of 43.0°, and the angle decreases from left to right to vertex 804 with an angle of 40.0°. All the way to the right, vertex angle 806 increases again to an angle of 40.5°.

Figure 63:
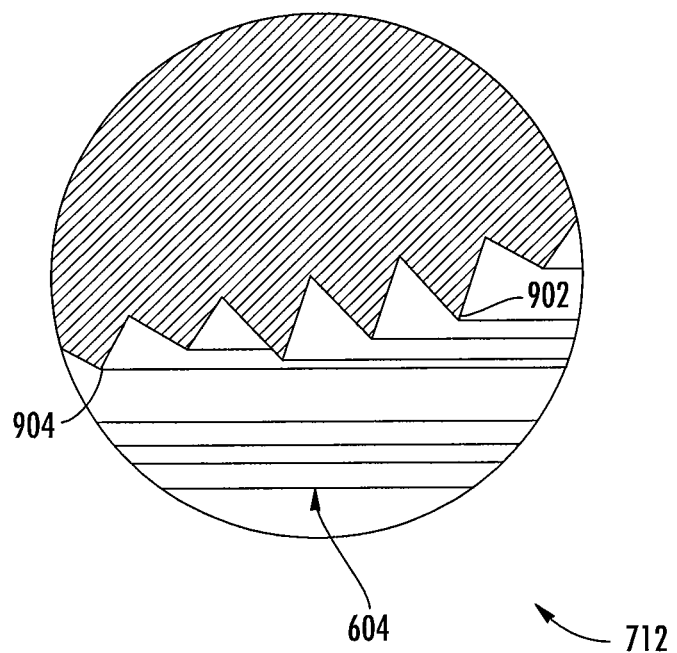
FIG. 63 is a magnified, cross-sectional view of the lens depicted in FIG. 61.

FIG. 63 shows a close-up, cross-sectional view of a portion of entry surface of lens 712. Substantially triangular concentric rings are visible, spaced and interval of 0.500 mm. These rings follow the curved contour of the entry or LED-facing surface of the lens. As can be observed in the figures, the vertex angle of the feature varies. Vertices 902 with a greater height have an angle of 60.0°, and vertices 904 have an angle of 90.0°.

Figure 64:
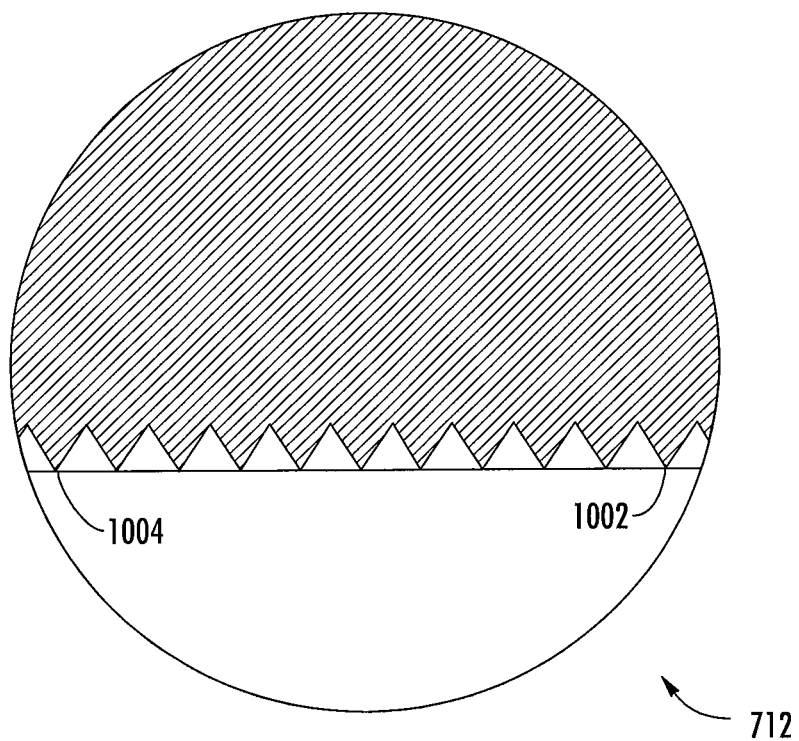
FIG. 64 is a magnified, cross-sectional view of the lens depicted in FIG. 61.
Figure 79:
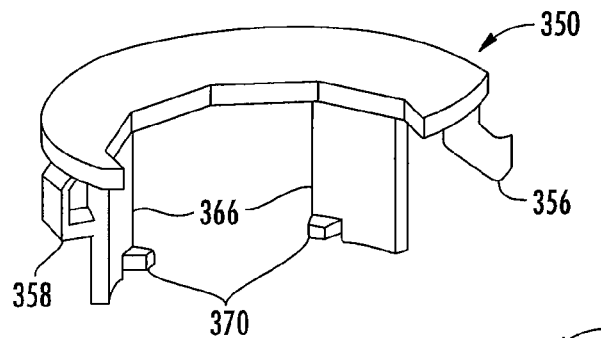
FIG. 79 is a perspective view of one portion of the reflector of FIG. 76.
Figure 80:
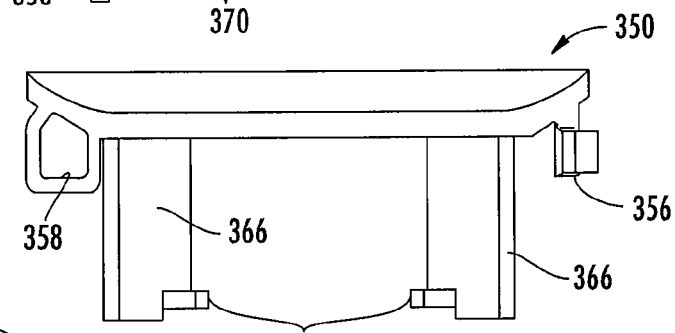
FIG. 80 is a side view of one portion of the reflector of FIG. 76.
Figure 81:
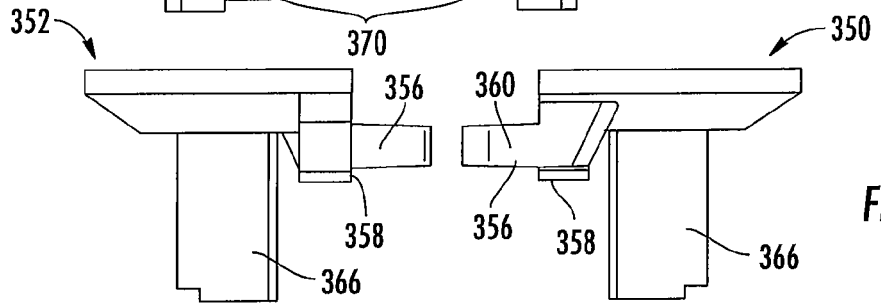
FIG. 81 is a front view of the reflector of FIG. 76 in a disassembled condition.
Figure 82:
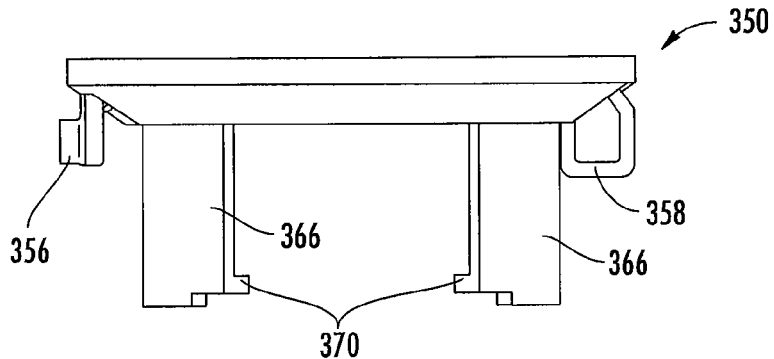
FIG. 82 is an alternate side view of one portion of the reflector of FIG. 76.
Figure 83:
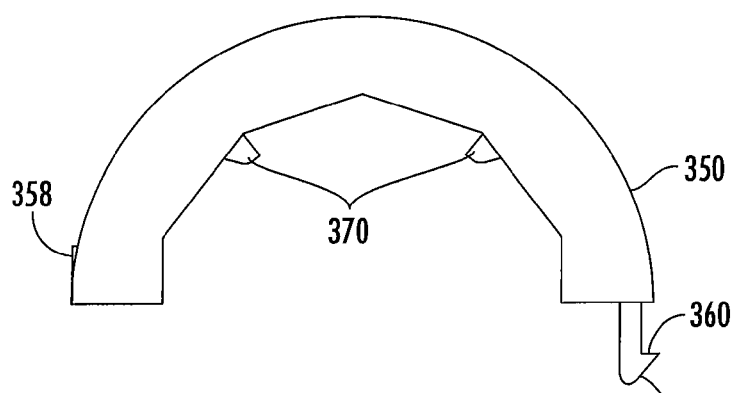
FIG. 83 is a top view of one portion of the reflector of FIG. 76.
Figure 84:
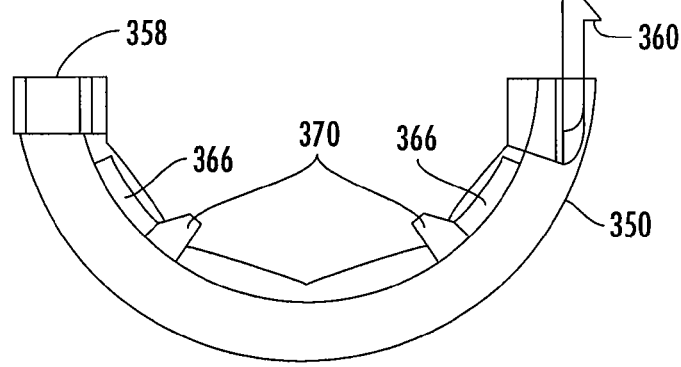
FIG. 84 is a bottom view of one portion of the reflector of FIG. 76.

FIG. 64 shows a close-up, cross-sectional view of a portion of entry surface of lens 712. Substantially triangular concentric rings are visible, again spaced at an interval of 0.500 mm. As can be observed in the figure, a gradient is applied to the vertex angle of the features. Vertex 1002 has an angle of 63.0°, and the angle decreases from left to right in the figure until vertex 1004 with an angle of 61.0°, in 0.40° increments.

A lens according to example embodiments of the invention can be made from various materials, including acrylic, polycarbonate, glass, polyarylate, and many other transparent materials. The textured exit surface of the lens can be created in many ways. For example, a smooth surface could be roughened. The surface could be molded with textured features. Such a surface may be, for example, prismatic in nature. A lens according to embodiments of the invention can also consist of multiple parts co-molded or co-extruded together. For example, the textured surface could be another material co-molded or co-extruded with the portion of the lens with the substantially triangular concentric rings.

The spacing, angles, and other features of the concentric rings can be varied either across lenses, or within the surface of a single lens in order to achieve various lighting effects. As examples, the vertex angle of the concentric rings can be varied. In some embodiments, the angle is from about 35° to about 90°. In some embodiments, the angle ranges from about 40° to about 65°. The angle can be constant across the radius of the lens, can have a gradient applied, or can vary in other ways, as with some of the examples presented herein. The spacing of the concentric features can similarly vary.

As further specific examples, lenses with the following specifications have been tested and shown to be effective for various beam shaping effects. These first examples all have a ring spacing across the radius of the lens of approximately 3 mm. A lens with vertex angles ranging from 70° to 86°, in one degree increments produces a wide beam. A lens with some vertex angles varying from 65° to 71°, and some angles fixed at 90° with the increment of the former being about 1° produces a flood pattern. A lens with some angles varying in 1° increments between 60° and 71°, some fixed at 71°, and others varying in 1° increments back from 71° to 68° produces a forward pattern. A set of fixed-angle features with a vertex angle of 40° produces a spot pattern with a beam angle of approximately 20°.

The following example embodiments that have been tested have a ring spacing across the radius of the lens of approximately 2 mm. A lens with rings having vertex angles varying from 60° to 84° in 1° increments produces a wide pattern. A lens with feature vertex angles varying from 60° to 70° in 1° increments, and additional rings having a fixed angle of approximately 90°, produces a flood pattern. A lens with some vertices varying from 60° to 69° in half-degree increments, four fixed rings with 69° vertices, and two additional rings with 68° and 69° vertices produces a forward pattern. A fixed vertex angle of 40° across the lens again produces a spot pattern with a beam angle of approximately 20°.

Example embodiments that have been tested with a ring spacing of 1 mm include a lens with a range of vertex angles varying from 70° to 82.25° in 0.25° increments, which produced a wide beam pattern. A lens with 50 rings, 25 with a fixed vertex angle of 90°, and 25 with a varying vertex angle from 60° to 72° in 0.25° increments produced a flood pattern. A lens with some rings varying in 0.50° increments from a vertex angle of 60° to a vertex angle of 73°, and some varying in 0.25° increments from an angle of 73° to angle of 68.25°, and three at a fixed vertex angle of 73°, produced a forward pattern. Finally, a lens with rings having a fixed vertex angle of 40° again produced a spot pattern with a beam angle of approximately 20°.

In addition to the detailed examples presented herein with a 0.5 mm spacing for the triangular concentric rings across the radius of the lens, the following examples were tested. These include rings with a range of vertex angles from 60° to 80° in 0.2° increments, which produced a wide beam pattern. A lens with 101 rings, 51 of which have vertex angles from 60° to 70° in 0.2° increments, and 50 of which have a fixed vertex angle of 90°, produced a flood pattern. A lens with 101 rings where 19 of them had a fixed vertex angle of 75°, and the remainder were split with vertex angles ranging from 60° to 75° in 0.25° increments and 75° to 70° in 0.25° increments produced a forward pattern. In addition to the above, it was found that maintaining a constant vertex angle across the radius of the lens but adjusting the angle from lens to lens produced a spot pattern which varied proportionately in angular size. For example, using features with a vertex angle of 35° produced a spot pattern with a beam angle of 32°. Using features with a vertex angle of 45° produced a spot pattern with a beam angle from 11° to 15° depending on the size of the LED source. A suitable lens for use in the lamp of the invention is disclosed in United States patent application entitled "Beam Shaping Lens and LED Lighting System Using Same", application Ser. No. 13/657,421, filed on Oct. 22, 2012, which is incorporated herein by reference in its entirety.

As is evident from the foregoing description, a lamp constructed using the primary reflector and the lens 702 may produce light with a beam angle that varies from a wide angle flood pattern to a tightly controlled spot pattern. As a result, the construction allows the lamp to replace either a wide angle lamp such as a BR lamp or a narrow beam angle lamp such as a PAR lamp.

As previously explained, the reflector 600 as described herein may be positioned such that the reflector 600 reflects a portion of the light generated by the LED assembly 130. However, at least a portion of the light generated by the LED assembly 130 may not be reflected by the reflector 600. At least some of this light may be reflected by the reflective surface of the enclosure. Some of the light generated by the LED assembly may be projected to the lens portion without being reflected by the reflector or the enclosure.

As was explained with respect to the previously described embodiments of a directional lamp, at least some of the light generated by the LED assembly 130 may be directed toward the exit surface of the lamp. An LED 127 positioned as described herein may have a beam angle of approximately 120° such that at least some of the light emitted from the LEDs 127 is directed directly out the exit surface. In order to capture this light and shape the beam, a reverse or downward facing reflector 1200 may be added as shown in FIGS. 65-75. The reverse reflector 1200 captures light that is projected toward the exit surface of the lamp and reflects that light from reflecting surface 1200a to the primary reflector such that the light may be projected in the desired beam angle by the primary reflector as described above. Any suitable reflector may be used as the reverse reflector to redirect the light toward the primary reflector.

Because the PAR and BR style lamps are intended to provide directional beams, asymmetrical LEDs may be advantageously used in various embodiments of the invention. Because the LED assembly 130 uses a plurality of LEDs 127 in the LED array 128, all of the LEDs 127 or selected ones of the LEDs may be asymmetrical LEDs. In some asymmetrical LEDs, the LED optic is shaped to produce the asymmetric beam. Embodiments could use an overmolded asymmetric optic (MDA style). The asymmetric beam may be arranged to directly exit the lamp from the exit surface without being reflected by any reflector surface. The asymmetric beam may also be arranged such that the beam is directed to a desired location on one of the reflectors described herein.

Depending on the embodiment, in the various embodiments described herein, the primary reflector may be configured to reflect light out towards the exit and/or at a secondary or outer reflector such that the reflector formed on the inner surface of the enclosure. Depending on the embodiment, the primary reflector can point upward, downward or be flat. The primary reflector may be positioned above, below or between LEDs on the LED assembly 130. Depending on the embodiment, the outer or secondary reflector, such as the reflector formed on the inner surface of the enclosure may be specular or diffuse.

The reflectors as described herein may also be used in an omnidirectional lamp such as the A19 style of lamp shown, for example, in FIG. 1. In an omnidirectional lamp the reflector may be used to provide a greater degree of up lighting, i.e. light toward the free end of the lamp opposite the Edison connector, if desired. In some embodiments, the reflector may have the same shape and size for a BR style lamp, a PAR style lamp and an omnidirectional lamp such as an A19 style lamp where the light is shaped using the material of the reflector. In an omnidirectional style lamp the reflector may be made of a semitransparent or translucent material such that some of the light is reflected but other light is allowed to pass through the reflector. Such an arrangement provides less directional reflection and a more omnidirectional pattern while still providing some light shaping. In a BR style light the reflector may be made of a white material that provides reflection of the light but in a somewhat diffused pattern. In a PAR style lamp the reflector may be made of or coated in a highly reflective material such as but not limited to aluminum or silver to provide specular reflection and a tightly shaped beam. The reflectors made with the various surfaces described herein may be of the same size and shape for the omnidirectional lamp and the directional lamps such that the same type of reflector may be used with the only change being the material in the different forms of the lamp.

Figure 85:
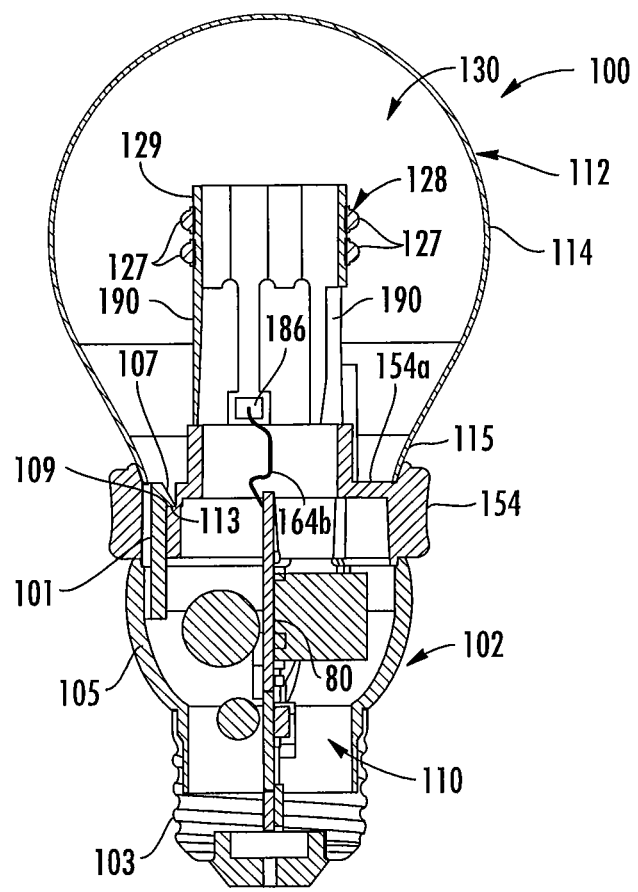
FIG. 85 is a section view of an alternate embodiment of the lamp of the invention.

In the various embodiments described herein, the LED assembly is in the form of an LED tower within the enclosure, the LEDs are mounted on the LED tower in a manner that mimics the appearance of a traditional incandescent bulb. As a result, the LEDs can be positioned on the LED tower in the same area that the glowing filament is visible in a traditional incandescent bulb. As a result, the lamps of the invention provide similar optical light patterns to a traditional incandescent bulb and provide a similar physical appearance during use. The mounting of the LED assembly on the tower, such that the LEDs are centered on the longitudinal axis of the lamp and are in a position that is centrally located in the enclosure, provides the look of a traditional incandescent bulb. Centrally located means that the LEDs are disposed on the tower in the free open space of the enclosure as distinguished from being mounted at or on the bottom of the enclosure or on the enclosure walls. In certain embodiments, the LEDs are positioned in a band about the tower such that the high intensity area of light produced from the LEDs appears as a glowing filament of light when in use. The band of LEDs could be produced by single or multiple rows or strings of LEDs that are closely packed together within the band or offset from each other within the band. Various configurations are possible where the LEDs are positioned in a band or concentrated in a particular region about the LED tower to produce a filament-type appearance when in use and when viewed from different directions. In some embodiments, the LEDs may be arranged on the tower such that they are in a relatively narrow band that is located near the optical center of the enclosure. In some embodiments, the LEDs may be arranged on the filament tower in a narrow band that extends around the periphery of the tower where the height of the band (in the dimension along the axis of the tower) is smaller than the diameter of the tower. As a result, the when the lamp is viewed from the side the LEDs create a bright light source that that extends across the lamp and appears as a relatively bright line inside of the enclosure. The band or concentrated region of LEDs can comprise less than 50%, less than 40% or even less than 30% of the exposed surface area of the tower. In some embodiments, the LED region is disposed toward one end of the array such that the region is offset from the center of the tower where the tower extends from the base to support the LED array at the desired location within the enclosure. The LEDs have been described as a band that extends around the periphery of the tower. In addition to extending around the periphery of the tower the LEDs also extend around or encircle the longitudinal axis of the lamp. In some embodiments, the tower is disposed along the longitudinal axis of the lamp such that the LEDs surround or extend around both the longitudinal axis of the lamp and the tower as shown in the Figures. In some embodiments the LEDs may be disposed such that the LEDs do not surround the tower but still surround the longitudinal axis of the lamp. Referring to FIG. 85, for example, the LED assembly 130 may be mounted directly to the heat dissipating portion 154 of the heat sink 149 using extensions 190 or similar structure where the tower 152 is eliminated. In such an arrangement the LEDs 127 surround the longitudinal axis of the lamp even though the LEDs do not surround the heat sink. Other arrangements are also possible where, for example, a tower 152 is provided but the LEDs are arranged beyond the end of the tower 152. In such an arrangement the LEDs 127 surround the longitudinal axis of the lamp even though the LEDs do not physically surround the heat sink.

Because, in some embodiments, the LEDs are closely packed or positioned in a more concentrated or more dense region of the tower, the tower is used as a heat sink that provides a thermal path from the LEDs to the base of the bulb. In some embodiments the base acts as part of the heat sink and may include fins or other surface area or mass increasing features. In some embodiments, the heat sink portion of the base includes an integral support or a portion of the tower over which the LED tower fits or to which the LED tower is connected such that a thermal path is from the LEDs through the filament tower to the support and/or to the base. In some embodiments, the base and support is an integral piece, and in other embodiments it is different pieces. In some embodiments, the support is part of the tower and/or thermal path, and in others it is not. In some embodiments, the support and/or base is not a major part of the thermal path in that the support and/or base is made of a poor thermal conductor, and the LED tower forms part of the thermal path to other portions of the bulb, such as the enclosure of the bulb, for example through thermally conductive gas or liquid within the enclosure. In some embodiments, the LED tower itself can provide sufficient thermal protection for the LEDs.

In some embodiments, depending on the LEDs used, the exit surfaces in these and other embodiments may be made of glass which has been doped with a rare earth compound, in this example, neodymium oxide. Such an optical element could also be made of a polymer, including an aromatic polymer such as an inherently UV stable polyester. The exit surface is transmissive of light. However, due to the neodymium oxide in the glass, light passing through the dome of the optical element is filtered so that the light exiting the dome exhibits a spectral notch. A spectral notch is a portion of the color spectrum where the light is attenuated, thus forming a "notch" when light intensity is plotted against wavelength. Depending on the type or composition of glass or other material used to form the optical element, the amount of neodymium compound present, and the amount and type of other trace substances in the optical element, the spectral notch can occur between the wavelengths of 520 nm and 605 nm. In some embodiments, the spectral notch can occur between the wavelengths of 565 nm and 600 nm. In other embodiments, the spectral notch can occur between the wavelengths of 570 nm and 595 nm. Such systems are disclosed in U.S. patent application Ser. No. 13/341,337, filed Dec. 30, 2011, titled "LED Lighting Using Spectral Notching" which is incorporated herein by reference in its entirety.

Although specific embodiments have been shown and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A lamp comprising:
   an optically transmissive enclosure;
   a base comprising an Edison connector;
   a heat sink comprising a tower extending from the base into the enclosure and supporting an LED assembly in the optically transmissive enclosure and a heat dissipating portion extending to the exterior of the lamp, the LED assembly comprising a plurality of LEDs operable to emit light when energized through an electrical path from the base, the tower and the LED assembly are arranged such that the plurality of LEDs are disposed about the periphery of the tower in a band and face outwardly toward the enclosure to create a source of the light that appears as a centrally located glowing portion.

2. The lamp of claim 1 wherein the LED assembly comprises a submount on which the plurality of LEDs are mounted.

3. The lamp of claim 2 wherein the submount comprises at least one of a PCB, metal core board, lead frame and metal core printed circuit board.

4. The lamp of claim 2 wherein the submount has a three-dimensional shape where a portion of the tower is inside of the submount and the plurality of LEDs are mounted on an outside surface of the submount.

5. The lamp of claim 2 wherein the submount comprises a connector portion that couples the LED assembly to the tower and electrically couples the LED assembly to the electrical path.

6. The lamp of claim 1 wherein the tower extends along the longitudinal axis of the lamp and the LED assembly is mounted on the tower such that at least some of the LEDs of the plurality of LEDs emit light laterally.

7. A lamp comprising:
   an optically transmissive enclosure;
   a base comprising an Edison screw adapted to engage an Edison socket;
   an LED assembly connected to the base and extending into the optically transmissive enclosure, the LED assembly comprising a plurality of LEDs operable to emit light when energized through an electrical path from the base, the LED assembly is arranged such that the plurality of LEDs are disposed about a longitudinal axis of the lamp in a band and face outwardly toward the enclosure to create a source of the light that visibly appears as a centrally glowing area.

8. The lamp of claim 7 wherein the LED assembly comprises a submount on which the plurality of LEDs are mounted.

9. The lamp of claim 8 wherein the submount comprises at least one of a PCB, metal core board, lead frame and metal core printed circuit board.

10. The lamp of claim 8 wherein the submount comprises a flat member that is bent into a three-dimensional shape where the plurality of LEDs are mounted on an outside surface of the submount.

11. The lamp of claim 8 wherein the submount comprises a connector portion that couples the LED assembly to a heat sink and electrically couples the LED assembly to the electrical path.

12. The lamp of claim 8 wherein the LED assembly is thermally coupled to a heat sink, the heat sink being located between the enclosure and the base.

13. A lamp comprising:
an optically transmissive enclosure;
a base;
a heat sink extending into the enclosure and supporting an LED assembly in the optically transmissive enclosure, the LED assembly operable to emit omnidirectional white light equivalent to at least a 40 watt incandescent bulb when energized through an electrical path from the base, the heat sink being thermally coupled to the LED assembly for transmitting heat from the LED assembly to the ambient environment where the heat sink and the LED assembly are arranged such that the LED assembly is disposed substantially in the optical center of the enclosure, the LED assembly comprising a plurality of LEDs disposed about the periphery of the heat sink.

14. The lamp of claim 13 wherein the LED assembly comprises a submount on which the plurality of LEDs are mounted.

15. The lamp of claim 14 wherein the submount comprises at least one of a PCB, metal core board, lead frame and metal core printed circuit board.

16. The lamp of claim 14 wherein the submount has a three-dimensional shape where a portion of the heat sink is inside of the submount and the plurality of LEDs are mounted on an outside surface of the submount.

17. The lamp of claim 14 wherein the submount comprises a connector portion that electrically couples the LED assembly to the electrical path.

18. The lamp of claim 13 wherein the heat sink extends along the longitudinal axis of the lamp and the LED assembly is mounted on the heat sink such that at least some of the LEDs of the plurality of LEDs emit light laterally.

19. The lamp of claim 13 wherein the plurality of LEDs are positioned in a band such that a high intensity area of light produced from the plurality of LEDs appears as a glowing line of light when energized.

20. The lamp of claim 19 wherein the band has a height and a length, the height of the band, in the dimension along a longitudinal axis of the lamp, being smaller than the length of the band.

21. A lamp comprising:
an optically transmissive enclosure;
a base;
an LED assembly disposed in the optically transmissive enclosure operable to emit light when energized through an electrical path;
a heat sink thermally coupled to the LED assembly for transmitting heat from the LED assembly to the ambient environment;
an electrical interconnect for mechanically connecting a conductor to the heat sink where the conductor is in the electrical path between the LED assembly and the base.

22. The lamp of claim 21 wherein the electrical conductor connects the LED assembly to lamp electronics in the base.

23. The lamp of claim 22 wherein the electrical conductor comprises a first contact that is electrically coupled with the LED assembly and a second contact that is electrically coupled with the lamp electronics.

24. The lamp of claim 23 comprising a first contact coupling between the first contact and the LED assembly and a second contact coupling between the second contact and the lamp electronics.

25. The lamp of claim 21 wherein the electrical interconnect comprises a body that retains the conductor and a second conductor where the conductor connects to one of an anode side or a cathode side of the LED assembly and the second conductor connects to the other one of the anode side or the cathode side of the LED assembly.

26. The lamp of claim 25 wherein the conductor forms a first LED-side contact and a first lamp electronics-side contact and the second conductor forms a second LED-side contact and a second lamp electronics-side contact.

27. The lamp of claim 25 wherein the electrical interconnect comprises an alignment mechanism that is configured to position the conductor and the second conductor relative to corresponding electrical contacts of the LED assembly and the lamp electronics.

28. The lamp of claim 21 wherein the electrical interconnect is secured to the heat sink by a snap fit connector.

29. The lamp of claim 24 wherein the first contact coupling comprises a first resilient member that deforms to bias into engagement with a first contact on the LED assembly and the second contact coupling comprises a second resilient member that deforms to bias into engagement with a first contact on the lamp electronics.

30. The lamp of claim 21 wherein a snap-fit connector connects the base to the heat sink.

* * * * *